(12) United States Patent
Shin

(10) Patent No.: US 11,502,147 B2
(45) Date of Patent: Nov. 15, 2022

(54) DISPLAY DEVICE

(71) Applicant: Samsung Display Co., LTD., Yongin-si (KR)

(72) Inventor: Min Chul Shin, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 174 days.

(21) Appl. No.: 16/943,857

(22) Filed: Jul. 30, 2020

(65) Prior Publication Data

US 2021/0104589 A1 Apr. 8, 2021

(30) Foreign Application Priority Data

Oct. 7, 2019 (KR) ........................ 10-2019-0123992

(51) Int. Cl.
*H01L 27/32* (2006.01)
*H01L 51/52* (2006.01)
*H01L 27/15* (2006.01)

(52) U.S. Cl.
CPC ........ *H01L 27/3258* (2013.01); *H01L 27/156* (2013.01); *H01L 27/3246* (2013.01); *H01L 51/5271* (2013.01); *H01L 27/322* (2013.01)

(58) Field of Classification Search
CPC . H01L 27/156; H01L 27/322; H01L 27/3246; H01L 27/3258; H01L 51/5271
See application file for complete search history.

(56) References Cited

U.S. PATENT DOCUMENTS

| 5,834,893 | A | 11/1998 | Bulovic et al. |
| 2014/0361265 | A1 | 12/2014 | Liu et al. |
| 2017/0117338 | A1* | 4/2017 | Shirahata ............ H01L 51/5271 |
| 2020/0044002 | A1* | 2/2020 | Jun ...................... H01L 51/5209 |
| 2021/0074955 | A1* | 3/2021 | Baek ................... H01L 27/3246 |

FOREIGN PATENT DOCUMENTS

| JP | 2005340011 A | 12/2005 |
| KR | 101600816 B1 | 3/2016 |
| KR | 1020180036465 A | 4/2018 |
| KR | 101900362 B1 | 11/2018 |
| KR | 101928582 B1 | 12/2018 |

\* cited by examiner

*Primary Examiner* — Changhyun Yi
(74) *Attorney, Agent, or Firm* — Cantor Colburn LLP

(57) ABSTRACT

A display device a includes: a transistor disposed on a first substrate; an insulating layer disposed on the transistor; a first electrode disposed on the insulating layer; a partition disposed on the first electrode and the insulating layer, an opening is defined through the partition; a light-emitting element layer disposed in the opening; and a second electrode disposed on the light-emitting element layer and the partition. The insulating layer includes a first region and a third region having different heights from each other and a second region having an inclined surface connecting the first region and the third region, the first region has a lower height than the third region, and the first electrode overlaps the first region in a direction perpendicular to the first substrate.

30 Claims, 25 Drawing Sheets

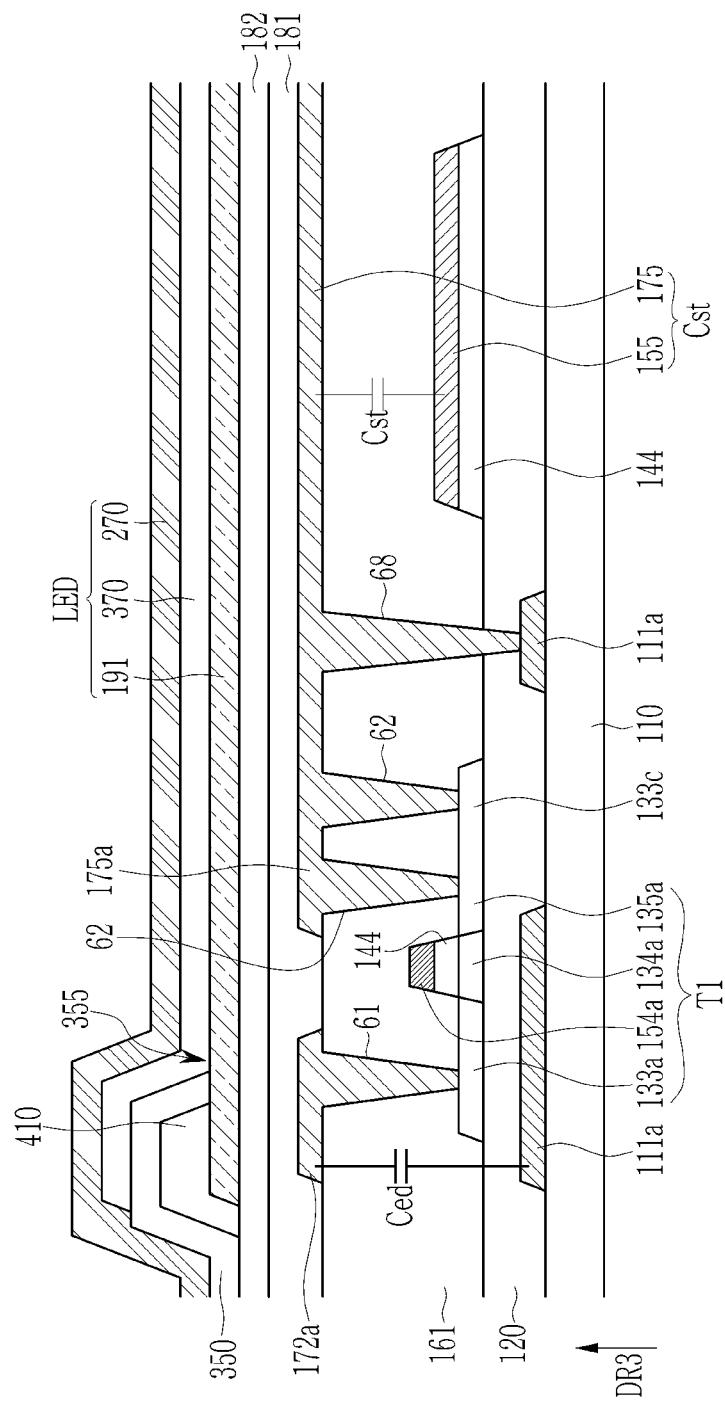

DISPLAY DEVICE

This application claims priority to Korean Patent Application No. 10-2019-0123992, filed on Oct. 7, 2019, and all the benefits accruing therefrom under 35 U.S.C. § 119, the content of which in its entirety is herein incorporated by reference.

BACKGROUND

(a) Field

The disclosure relates to a display device, and more particularly, to a display device with improved luminous efficiency.

(b) Description of the Related Art

Among display devices, which display images, a light emitting diode display has been in the spotlight.

The light emitting diode display has a self-luminance characteristic and may not include a separate light source, unlike a liquid crystal display ("LCD") device, and thus may have reduced thickness and weight. Further, the light emitting diode display may have desired quality characteristics such as low power consumption, high luminance, and a high reaction speed.

Generally, the light emitting diode display includes a substrate, a plurality of thin film transistors disposed on the substrate, a plurality of insulating layers disposed between elements the thin film transistors, and a light emitting element connected to the thin film transistor.

Recently, display devices including a color conversion layer have been proposed to realize high efficiency display devices.

SUMMARY

Exemplary embodiments are to provide a display device with improved light emission efficiency by increasing reflectance and reducing absorption of light emitted from the light-emitting element.

According to an embodiment of the invention, a display device includes: a transistor disposed on a first substrate; an insulating layer disposed on the transistor; a first electrode disposed on the insulating layer; a partition disposed on the first electrode and the insulating layer, where an opening is defined through the partition; a light-emitting element layer disposed in the opening; and a second electrode disposed on the light-emitting element layer and the partition, wherein the insulating layer includes a first region and a third region having different heights from each other and a second region having an inclined surface connecting the first region and the third region, the first region has a lower height than the third region, and the first electrode overlaps the first region in a direction perpendicular to the first substrate.

In an embodiment, the partition may include an inorganic material including silicon.

In an embodiment, the partition may further include carbon.

In an embodiment, the partition may include at least one material selected from SiOx, SiNx, SiON, and siloxane.

In an embodiment, the thickness of the partition may be in a range of about 1000 angstrom (Å) to about 3000 Å.

In an embodiment, a refractive index difference of the partition and the light-emitting element layer may be less than about 50% of a refractive index of the partition.

In an embodiment, the partition may have an inclined surface overlapping the second region.

In an embodiment, the first electrode in the second region may be disposed between the insulating layer and the partition.

In an embodiment, a lowermost surface of the second electrode may be closer to the first substrate than an uppermost surface of the partition.

In an embodiment, a lower surface of the second electrode may be disposed at a same height as an upper surface of the opening of the partition.

In an embodiment, an uppermost surface of the partition may be disposed closer to the first substrate than a lowermost surface of the second electrode.

In an embodiment, a second substrate overlapping the first substrate, and a color conversion layer disposed on the second substrate may be further included, and the color conversion layer may be disposed overlapping the light-emitting element layer in the direction perpendicular to the first substrate.

In an embodiment, the light-emitting element layer may emit a blue light.

In an embodiment, the partition may include an organic material.

According to another embodiment of the invention, a display device includes: a transistor disposed on a substrate; an insulating layer disposed on the transistor; a first electrode disposed on the insulating layer; a reflection member disposed between the insulating layer and the first electrode; a partition disposed on the first electrode and the insulating layer, where an opening is defined through the partition; a light-emitting element layer disposed in the opening; and a second electrode disposed on the light-emitting element layer and the partition, where a side surface of the reflection member adjacent to the opening includes an inclined surface.

In an embodiment, the reflection member may include a metal.

In an embodiment, the reflection member may have a multilayer structure of one among Ti/Al/Ti, Mo/Al/Mo, and Ti/Cu.

In an embodiment, the first electrode may be disposed over the reflection member.

In an embodiment, the partition may be disposed on the reflection member, and the first electrode may be disposed between the reflection member and the partition on the inclined surface of the reflection member.

In an embodiment, a lowermost surface of the second electrode may be closer to the first substrate than an uppermost surface of the partition.

In an embodiment, a lower surface of the second electrode may be disposed at a same height as an upper surface of the opening of the partition.

In an embodiment, an uppermost surface of the partition may be closer to the first substrate than a lowermost surface of the second electrode.

According to another embodiment of the invention, a display device includes: a transistor disposed on a substrate; an insulating layer disposed on the transistor; a first electrode disposed on the insulating layer; a reflection member disposed on the first electrode; a partition disposed on the first electrode, the reflection member and the insulating layer, where an opening is defined through the partition; a light-emitting element layer disposed in the opening; and a second electrode disposed on the light-emitting element layer and the partition, where a side surface of the reflection member adjacent to the opening includes an inclined surface.

In an embodiment, the reflection member may include a metal.

In an embodiment, the reflection member may have a multilayer structure of one among Ti/Al/Ti, Mo/Al/Mo, and Ti/Cu.

In an embodiment, a partial region of the reflection member may not overlap the first electrode in a direction perpendicular to the first substrate.

In an embodiment, one side surface of the reflection member and one side surface of the first electrode may be aligned with each other.

In an embodiment, a lowermost surface of the second electrode may be closer to the first substrate than an uppermost surface of the partition.

In an embodiment, a lower surface of the second electrode may be disposed at the same height as an upper surface of the opening of the partition.

In an embodiment, an uppermost surface of the partition may be disposed closer to the first substrate than a lowermost surface of the second electrode.

In an embodiment, the partition may be disposed on the reflection member.

According to embodiments of the invention, a display device with improved light emission efficiency by increasing reflectance of light emitted from the light-emitting element and reducing light absorption is provided.

BRIEF DESCRIPTION OF THE DRAWINGS

FIGS. 23 to 25 are cross-sectional views showing a display device according to an alternative exemplary embodiment.

DETAILED DESCRIPTION

Figure 1:
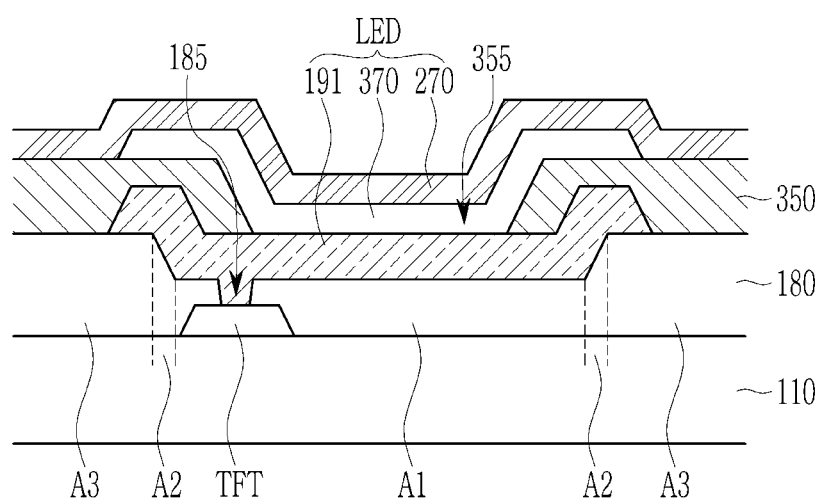
FIG. 1 is a cross-sectional view schematically showing a display device according to an exemplary embodiment of the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In order to clearly describe the invention, portions that are not connected with the description will be omitted. Like reference numerals designate like elements throughout the specification.

In addition, the size and thickness of each configuration shown in the drawings are arbitrarily shown for understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Hereinafter, a display device according to an exemplary embodiment of the invention will be described in detail with reference to accompanying drawings.

FIG. 1 is a view schematically showing a display device according to an exemplary embodiment of the invention. FIG. 1 schematically illustrates a portion of an exemplary embodiment of the display device according to the invention for convenience of illustration and description, and an actual cross-sectional structure of the display device may be different from that shown in FIG. 1.

Referring to FIG. 1, an exemplary embodiment of the display device includes a first substrate 110, and a transistor TFT and an insulating layer 180 disposed on the first substrate 110.

In such an embodiment, a first electrode 191 is connected to the transistor TFT through a contact hole 185 defined or formed in the insulating layer 180. Although the transistor TFT is schematically illustrated in FIG. 1, the transistor TFT includes a gate electrode, a semiconductor layer, a source electrode and a drain electrode, and the first electrode 191 may be connected to the drain electrode of the transistor TFT.

A partition 350, in which an opening 355 is defined, is disposed on the first electrode 191. A second electrode 270 is disposed on the partition 350, and a light-emitting element layer 370 is disposed between the first electrode 191 and the second electrode 270. The first electrode 191, the second electrode 270, and the light-emitting element layer 370 are collectively referred to as a light-emitting element LED.

Referring to FIG. 1, the insulating layer 180 includes a first region A1, a second region A2, and a third region A3.

The first region A1 and the third region A3 may have different heights from each other. Herein, the term "height" of a region of the insulating layer 180 means a distance of the region from the first substrate 110 in a thickness direction of the first substrate 110. The first region A1 may have a smaller thickness than the third region A3. In such an embodiment, the top of the first region A1 is disposed closer to the first substrate 110 than the top of the third region A3. The second region A2 is a part connecting the first region A1 and the third region A3, and has an inclined surface.

Referring to FIG. 1, the first electrode 191 is disposed overlapping the first region A1, the second region A2 and the third region A3 in the direction perpendicular to the first substrate 110. In such an embodiment, an entire portion of the first region A1 overlaps the first electrode 191.

The partition 350 overlaps part of the first region A1, the second region A2, and the third region A3. The partition 350 may have an inclined surface similar to the second region A2.

The light-emitting element layer 370 is disposed overlapping the first region A1 and the second region A2 in the direction perpendicular to the first substrate 110. The light-emitting element layer 370 may be disposed along the inclined surface of the second region A2.

The second electrode 270 is disposed overlapping the first region A1, the second region A2, and the third region A3 in the direction perpendicular to the first substrate 110.

In such an embodiment, as above-described, the light-emitting element LED is disposed overlapping the first region A1 having the smaller thickness of the insulating layer 180 and the second region A2 of the inclined surface, such that the light emitted to the side of the light-emitting element layer 370 is reflected by the first electrode 191, thereby increasing light emission efficiency.

In an exemplary embodiment of the display device, the partition 350 includes an inorganic material. The partition 350 may include an inorganic material including silicon. In one exemplary embodiment, for example, the partition 350 may include at least one material selected from SiOx, SiNx, SiON, and siloxane. Here, x may be 1 to 4. In an exemplary embodiment, the partition 350 may further include carbon in the inorganic material including silicon (Si).

In a case where the partition 350 includes an inorganic material including silicon Si, absorption of light at a lower wavelength is relatively low compared to a case where the partition 350 includes the organic material. In such an embodiment, the partition 350 includes an inorganic material having a low light absorption, such that the amount that the light reflected from the first electrode 191 located in the second region A2 is absorbed by the partition 350 is reduced and the transmitted amount is increased, thereby improving the light emission efficiency.

In an exemplary embodiment, a refractive index of the partition 350 may be similar to that of the light-emitting element layer 370. In one exemplary embodiment, for example, a refractive index difference of the partition 350 and the light-emitting element layer 370 may be less than about 50% of the refractive index of the partition 350. In such an embodiment, as above-described, where the refractive index of the partition 350 is similar to that of the light-emitting element layer 370, the light reflected from the first electrode 191 may easily exit the interface of the partition 350 and the light-emitting element layer 370. If the refractive index difference between the partition 350 and the light-emitting element layer 370 is large, total reflection may occur at the interface. Also, as the refractive index difference is increased, it is harder for light to escape from the partition 350.

In a case where the partition 350 includes the organic material, even if the insulating layer 180 has a stepped structure as shown in FIG. 1, the light reflected from the inclined surface of the first electrode 191 is absorbed by the partition 350 in the process of passing through the partition 350, thus the luminous efficiency may not be sufficiently increased. Particularly, when the light-emitting element layer 370 emits blue light, the absorption at the partition 350 including the organic material is high. Therefore, in the case of a color conversion display device in which the light-emitting element layer 370 emits the blue light that is subsequently converted into red light and green light through a color conversion panel, the light emission efficiency increase may not be fully effective by forming the inclined surface of the insulating layer 180 alone.

In an exemplary embodiment of the display device, the insulating layer 180 includes the first region A1 having a thin thickness, the second region A2 of the inclined surface, and the third region A3 that is thicker than the first region A1, and the partition 350 includes the inorganic material. Accordingly, the light emission efficiency may be increased by reflecting the light emitted to the side through the first electrode 191 positioned in the second region A2, and the light emission efficiency may be increased by reducing the amount of the light absorbed by the partition 350.

In an alternative exemplary embodiment, the partition 350 may include the organic material. In such an embodiment, the partition 350 may include both organic and inorganic materials, or only the organic material. In an exemplary embodiment, where the partition includes only the organic material, the light emission efficiency may be increased through the inclined surface of the insulating layer 180.

Figure 2:
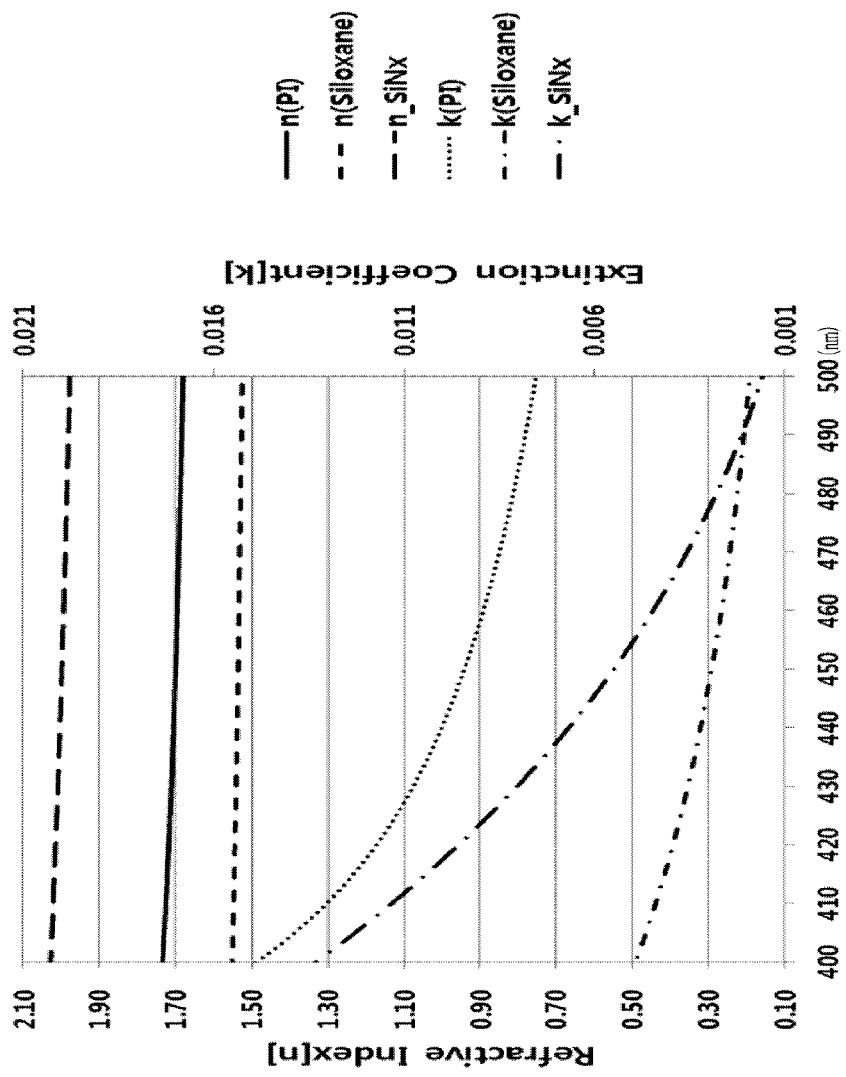
FIG. 2 is a graph showing a refractive index and an extinction coefficient depending on a wavelength for polyimide ("PI") as an organic material, siloxane as an inorganic material, and SiNx.

FIG. 2 is a graph showing a refractive index and an extinction coefficient for polyimide ("PI") as an organic material, siloxane as an inorganic material, and SiNx. FIG. 2 shows the refractive index and the extinction coefficient versus a wavelength (nm) of light.

Referring to FIG. 2, it may be shown that SiNx and siloxane as inorganic materials have lower extinction coefficients compared with polyimide as the organic material. In such an embodiment, it may be confirmed that SiNx has a low extinction coefficient, and the difference of the extinction coefficient with polyimide is significant in a short wavelength region. Therefore, in the light-emitting element emitting the blue light, when the partition is formed of SiNx, the absorption of the reflected light by the partition may be minimized.

Referring back to FIG. 1, the lowermost surface of the second electrode 270 may be disposed to be lower than the uppermost surface of the partition 350. The lower surface of the second electrode 270 is disposed within the opening 355 of the partition 350. That is, the lowermost surface of the second electrode 270 is disposed closer to the first substrate 110 than the uppermost surface of the partition 350.

Therefore, most of the light emitted from the light-emitting element layer 370 between the first electrode 191 and the second electrode 270 is reflected at the top and the side inclined surfaces of the first electrode 191 to maximize the light emission efficiency.

In an exemplary embodiment of the invention, since the partition 350 includes the inorganic material, the partition 350 may be formed with a uniform thickness on the first electrode 191 and the insulating layer 180. Although the thickness of the partition 350 in FIG. 1 is slightly different from region to region, this is a modification to clarify the characteristics of the invention, and the actual thickness of the partition 350 may be uniform.

It is also possible to form the partition 350 thin, as the partition 350 includes the inorganic material. In one exemplary embodiment, for example, the thickness of the partition 350 may be in a range of about 1000 angstrom (Å) to about 3000 Å.

The first electrode 191 is a reflecting electrode, and may be a multilayer including a transparent conductive oxide layer and a metal layer. In one exemplary embodiment, for example, the first electrode may have a triple layered structure of ITO/Ag/ITO.

Figure 3:
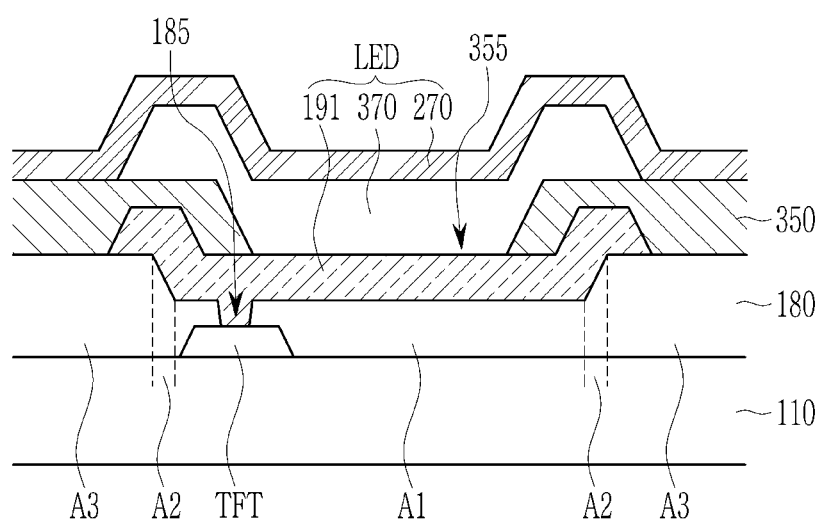
FIG. 3 is a cross-sectional view showing a display device according to an alternative exemplary embodiment of the invention.

FIG. 3 is a cross-sectional view showing a display device according to an alternative exemplary embodiment of the invention. The exemplary embodiment of the display device shown in FIG. 3 is substantially the same as the exemplary embodiment described above with reference to FIG. 1, except for a height relationship of the partition 350 and the second electrode 270. The same or like elements shown in FIG. 3 have been labeled with the same reference characters as used above to describe the exemplary embodiment of the display device shown in FIG. 1, and any repetitive detailed description thereof will hereinafter be omitted or simplified.

Referring to FIG. 3, the upper surface of the partition 350 and the lower surface of the second electrode 270 may be disposed at a same height or level from an upper surface of the first substrate 110. In such an embodiment, the upper surface of the partition 350 adjacent to the opening 355 of the partition 350 and the lower surface of the second electrode 270 disposed in the opening 355 may be disposed on an imaginary horizontal line or plane parallel to the first substrate 110. In such an embodiment where the upper surface of the partition 350 and the lower surface of the second electrode 270 are disposed at the same height as each other, most of the light emitted from the light-emitting element layer 370 disposed between the first electrode 191 and the second electrode 270 is reflected by the inclined surface and the upper surface of the first electrode 191, thereby increasing the light emitting efficiency.

Figure 4:
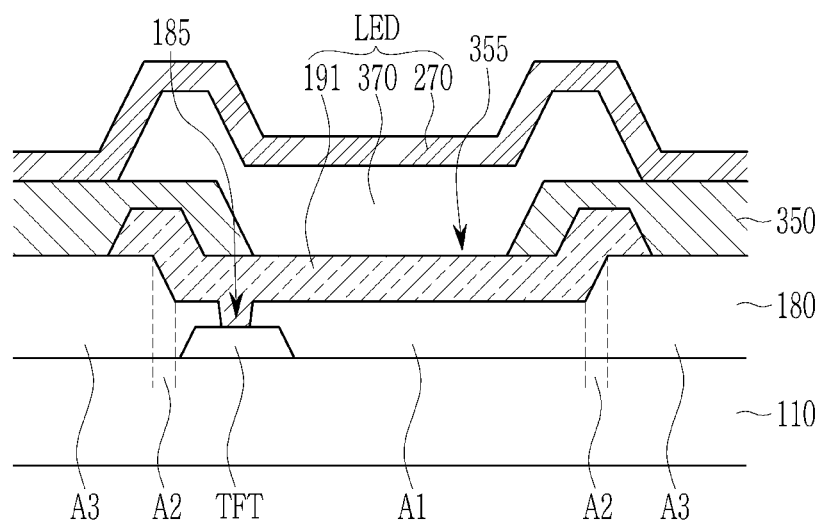
FIG. 4 is a cross-sectional view showing a display device according to another alternative exemplary embodiment of the invention.

FIG. 4 is a cross-sectional view showing a display device according to another alternative exemplary embodiment of the invention. The exemplary embodiment of the display device shown in FIG. 4 is substantially the same as the exemplary embodiment described above with reference to FIG. 1, except for the height relationship of the partition 350 and the second electrode 270. The same or like elements shown in FIG. 4 have been labeled with the same reference characters as used above to describe the exemplary embodiment of the display device shown in FIG. 1, and any repetitive detailed description thereof will hereinafter be omitted or simplified.

Referring to FIG. 4, the second electrode 270 is not disposed within the opening 355 of the partition 350. That is, the lowermost surface of the second electrode 270 in the first region A1 is disposed above the uppermost surface of the partition 350 or farther from the first substrate 110 than the uppermost surface of partition 350. Such a structure may be formed when the partition 350 including the inorganic material is formed thin and the light-emitting element layer 370 is formed thick. In such an embodiment shown in FIG. 4, most of the light emitted laterally in the light-emitting element layer 370 disposed between the first electrode 191 and the second electrode 270 is reflected by the inclined surface of the first electrode 191, thereby improving the light emission efficiency.

In an exemplary embodiment, as above-described, the display device includes the first region A1 and the third region A3 in which the insulating layer 180 has different heights from each other, and the second region A2 having the inclined surface connecting the first region A1 and the third region A3. The first electrode 191 is disposed along the inclined surface of the second region A2, and the light emitted from the side of the light-emitting element layer 370 is reflected from the side of the first electrode 191, thereby increasing the luminous efficiency. In such an embodiment, the partition 350 includes the inorganic material, such that the light emission efficiency may be improved by increasing the transmittance of the light reflected from the first electrode 191. In such an embodiment, the partition 350 may have a refractive index that is similar to that of the light-emitting element layer 370, and the light may easily exit the interface of the partition 350 and the light-emitting element layer 370, thereby increasing the light emission efficiency.

Figure 5:
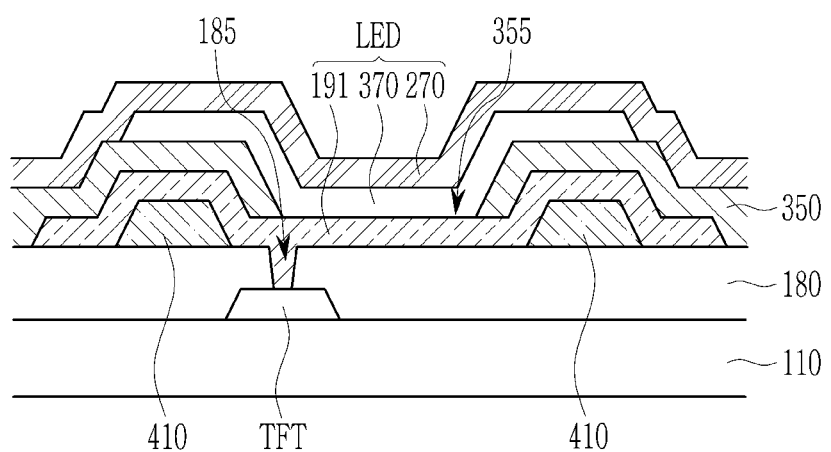
FIG. 5 is a cross-sectional view showing a display device according to another alternative exemplary embodiment of the invention.

Next, a display device according to another alternative exemplary embodiment of the invention will be described. FIG. 5 is a cross-sectional view showing a display device according to another alternative exemplary embodiment of the invention. The exemplary embodiment of the display device shown in FIG. 5 is substantially the same as the exemplary embodiment of the display device described above with reference to FIG. 1, except for a configuration of the insulating layer 180 and a reflection member 410. The same or like elements shown in FIG. 5 have been labeled with the same reference characters as used above to describe the exemplary embodiment of the display device shown in FIG. 1, and any repetitive detailed description thereof will hereinafter be omitted or simplified.

Referring to FIG. 5, in an exemplary embodiment of the display device, the insulating layer 180 has a substantially constant height or thickness without the first region and the second region having different heights or thickness from each other. In such an embodiment, the insulating layer 180 may have a flat upper surface. In such an embodiment, the display device includes a reflection member 410 disposed between the insulating layer 180 and the first electrode 191.

The side surface of the reflection member 410 may be inclined. The first electrode 191 may be disposed on the upper surface and the inclined side surface of the reflection member 410. In such an embodiment, since the first electrode 191 has the inclined side surface corresponding to the side surface of the reflection member 410, the light emitted to the side surface of the light-emitting element layer 370 may be reflected by the first electrode 191 and the reflection member 410, thereby increasing the light emission efficiency.

The reflection member 410 may include a metal. The reflection member 410 may have a single layer structure or a multi-layer structure. In one exemplary embodiment, for example, the reflection member 410 may have a triple layered structure of Ti/Al/Ti or Mo/Al/Mo. Alternatively, the reflection member 410 may have a dual-layered structure of Ti/Cu. However, the material of the reflection member 410 is not limited to the above material, and any metal having a reflection property may be used without limitation.

In an exemplary embodiment, as shown in FIG. 5, the shape of the reflection member 410 may be a trapezoid when viewed from a cross-sectional view perpendicular to the first substrate 110, but the shape of the reflection member 410 is not limited thereto. In an exemplary embodiment, the reflection member 410 is not limited in the shape as long as the side surface of the region adjacent to the opening of the partition 350 includes an inclined surface. Alternatively, the shape of the reflection member 410 when viewed from the cross-sectional view perpendicular to the first substrate 110 may be a triangle or a quadrangle including only one inclined surface.

In such an embodiment, the partition 350 may include an organic material or an inorganic material. In one exemplary embodiment, for example, the partition 350 may include an inorganic material including Si. The partition 350 may include at least one material selected from SiOx, SiNx, SiON, and siloxane. In such an embodiment, the partition 350 may further include carbon in the inorganic material including silicon.

In a case where the partition 350 includes the inorganic material including Si, the absorption for the light of the lower wavelength is relatively low compared with a case where the partition 350 includes the organic material. In an exemplary embodiment where the partition 350 includes an inorganic material having a low light absorption, the amount that the light reflected from the reflection member 410 is absorbed to the partition 350 is reduced, thereby increasing the light emission efficiency.

The refractive index of the partition 350 may be similar to that of the light-emitting element layer 370. In one exemplary embodiment, for example, the difference between the refractive index of the partition 350 and the light-emitting element layer 370 may be about 50% or less. In an exemplary embodiment, as above-described, when the refractive index of the partition 350 is similar to that of the light-emitting element layer 370, the light reflected from the reflection member 410 may easily exit the interface of the partition 350 and the light-emitting element layer 370.

Figure 6:
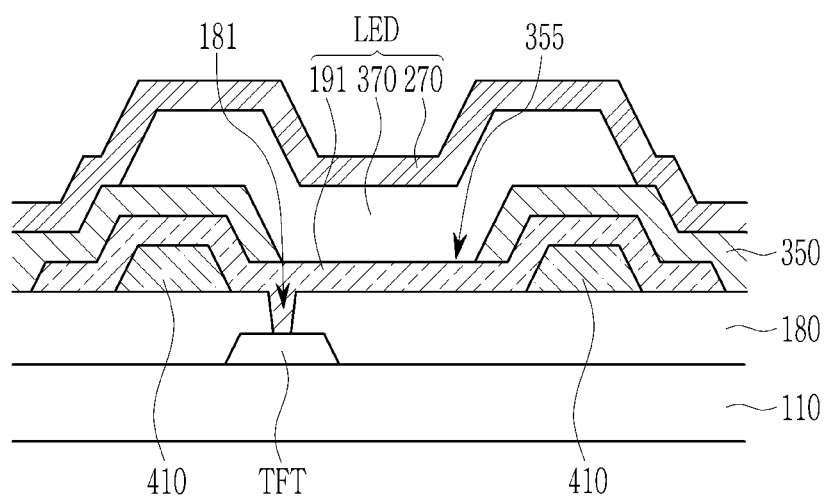
FIG. 6 is a cross-sectional view showing a display device according to another alternative exemplary embodiment of the invention.

FIG. 6 is a cross-sectional view showing a display device according to another alternative exemplary embodiment of the invention. The exemplary embodiment of the display device shown in FIG. 6 is substantially the same as the exemplary embodiment described above with reference to FIG. 5, except for a height relationship between the partition 350 and the second electrode 270. The same or like elements shown in FIG. 6 have been labeled with the same reference characters as used above to describe the exemplary embodiment of the display device shown in FIG. 5, and any repetitive detailed description thereof will hereinafter be omitted or simplified.

Referring to FIG. 6, in an exemplary embodiment, the upper surface of the partition 350 and the lower surface of the second electrode 270 may be disposed at a same height or level from an upper surface of the first substrate 110. In such an embodiment, the upper surface of the partition 350 adjacent to the opening of the partition 350 and the lower surface of the second electrode 270 disposed in the opening may be disposed on an imaginary horizontal line or plane parallel to the first substrate 110. In such an embodiment where the upper surface of the partition 350 and the lower surface of the second electrode 270 are disposed at the same height as each other, most of the light emitted from the light-emitting element layer 370 disposed between the first electrode 191 and the second electrode 270 to the side surface is reflected by the inclined surface of the reflection member 410, thereby increasing the light emitting efficiency.

Figure 7:
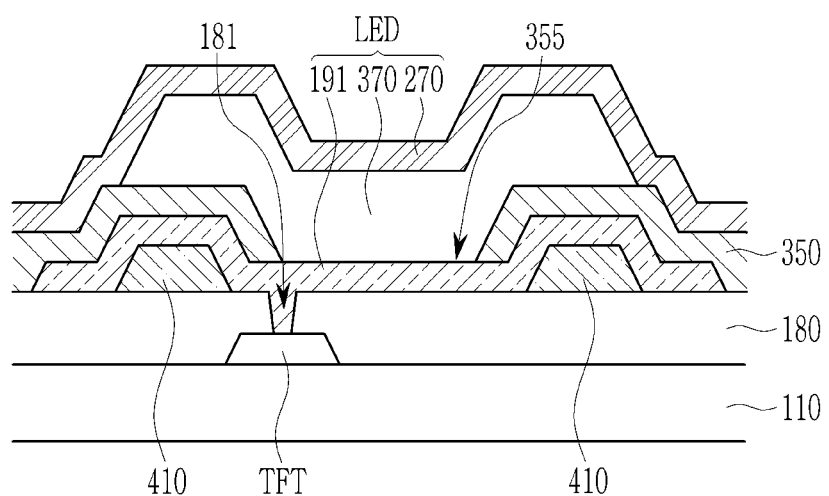
FIG. 7 is a cross-sectional view showing a display device according to another alternative exemplary embodiment of the invention.

FIG. 7 is a cross-sectional view showing a display device according to another alternative exemplary embodiment of the invention. The exemplary embodiment of the display device shown in FIG. 7 is substantially the same as the exemplary embodiment described above with reference to FIG. 5, except for the height relationship of the partition 350 and the second electrode 270. The same or like elements shown in FIG. 7 have been labeled with the same reference characters as used above to describe the exemplary embodiment of the display device shown in FIG. 5, and any repetitive detailed description thereof will hereinafter be omitted or simplified.

Referring to FIG. 7, in an exemplary embodiment, the second electrode 270 is not disposed within the opening 355 of the partition 350. In such an embodiment, the lowermost surface of the second electrode 270 overlapping the opening 355 of the partition 350 is disposed above the uppermost surface of the partition 350 or farther from the first substrate 110 than the uppermost surface of the partition 350. In such an embodiment shown in FIG. 7, most of the light emitted laterally in the light-emitting element layer 370 disposed between the first electrode 191 and the second electrode 270 is reflected by the inclined surface of the reflection member 410, thereby improving the light emission efficiency.

Figure 8:
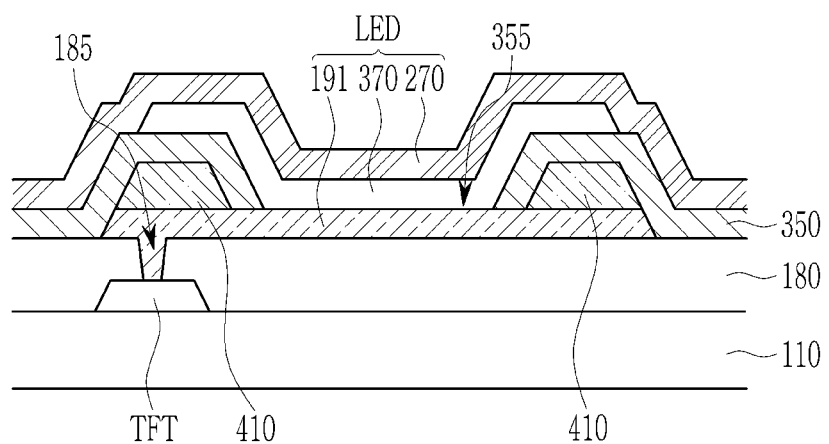
FIG. 8 is a cross-sectional view showing a display device according to another alternative exemplary embodiment of the invention.

FIG. 8 is a cross-sectional view showing a display device according to another alternative exemplary embodiment. The exemplary embodiment of the display device shown in FIG. 8 is substantially the same as the exemplary embodiment of the display device described above with reference to FIG. 1, except for the configuration of the insulating layer 180 and the reflection member 410. The same or like elements shown in FIG. 8 have been labeled with the same reference characters as used above to describe the exemplary embodiment of the display device shown in FIG. 1, and any repetitive detailed description thereof will hereinafter be omitted or simplified.

Referring to FIG. 8, in an exemplary embodiment of the display device, the insulating layer 180 has a substantially same height or a substantially constant thickness without the first region and the second region having different heights from each other. In such an embodiment, as shown in FIG.

8, the display device includes the reflection member 410 disposed on the first electrode 191.

The side surface of the reflection member 410 may be inclined. The light emitted to the side surface of the light-emitting element layer 370 is reflected by the reflection member 410, thereby increasing the light emission efficiency.

The reflection member 410 may include a metal. The reflection member 410 may have a single layer structure or a multi-layer structure. In one exemplary embodiment, for example, the reflection member 410 may have a triple layered structure of Ti/Al/Ti or Mo/Al/Mo. Alternatively, the reflection member 410 may have a dual layered structure of Ti/Cu. However, the material of the reflection member 410 is not limited to the above material, and any metal with the reflection property may be used without limitation.

Referring to FIG. 8, in an exemplary embodiment, one edge of the reflection member 410 and one edge of the first electrode 191 may be disposed on a same plane. In such an embodiment, one side surface of the reflection member 410 and one side surface of the first electrode 191 are aligned with each other to form a same inclined surface. This structure may be formed when forming the reflection member 410 and the first electrode 191 in a single process using a halftone mask. In such an embodiment, as shown in FIG. 8, the side surface of the reflection member 410 and the side surface of the first electrode 191 may be disposed on a same plane.

In an exemplary embodiment, the partition 350 may include an organic material or an inorganic material. The partition 350 may include an inorganic material including Si. In one exemplary embodiment, for example, the partition 350 may include at least one material selected from SiOx, SiNx, SiON, and siloxane. In such an embodiment, the partition 350 may further include carbon in the inorganic material including silicon.

In a case where the partition 350 includes the inorganic material including Si, the absorption is relatively low for the light of low wavelengths compared with a case where the partition 350 includes the organic material. In an exemplary embodiment, the partition 350 includes an inorganic material having a low light absorption, such that the amount that the light reflected from the reflection member 410 is absorbed by the partition 350 is reduced, thereby improving the light emission efficiency.

The refractive index of the partition 350 may be similar to that of the light-emitting element layer 370. In one exemplary embodiment, for example, the refractive index difference between the partition 350 and the light-emitting element layer 370 may be about 50% or less. In such an embodiment, as above-described, the refractive index of the partition 350 is similar to that of the light-emitting element layer 370, such that the light reflected from the reflection member 410 may easily exit the interface of the partition 350 and the light-emitting element layer 370.

Figure 9:
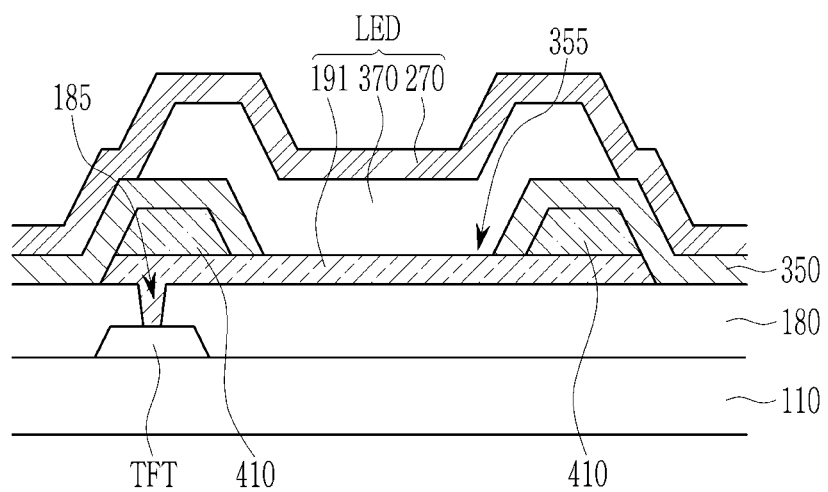
FIG. 9 is a cross-sectional view showing a display device according to another alternative exemplary embodiment of the invention.

FIG. 9 is a cross-sectional view showing a display device according to another alternative exemplary embodiment of the invention. The exemplary embodiment of the display device shown in FIG. 9 is substantially the same as the exemplary embodiment described above with reference to FIG. 8, except for the height relationship of the partition 350 and the second electrode 270. The same or like elements shown in FIG. 9 have been labeled with the same reference characters as used above to describe the exemplary embodiment of the display device shown in FIG. 8, and any repetitive detailed description thereof will hereinafter be omitted or simplified.

Referring to FIG. 9, in an exemplary embodiment, the upper surface of the partition 350 and the lower surface of the second electrode 270 may be disposed at a same height or level from an upper surface of the first substrate 110. In such an embodiment, the upper surface of the partition 350 adjacent to the opening of the partition 350 and the lower surface of the second electrode 270 disposed at the opening may be disposed on an imaginary horizontal line or plane parallel to the first substrate 110. In such an embodiment where the upper surface of the partition 350 and the lower surface of the second electrode 270 are disposed at the same height as each other, most of the light emitted from the light-emitting element layer 370 disposed between the first electrode 191 and the second electrode 270 is reflected by the inclined surface of the reflection member 410, thereby increasing the light emitting efficiency.

Figure 10:
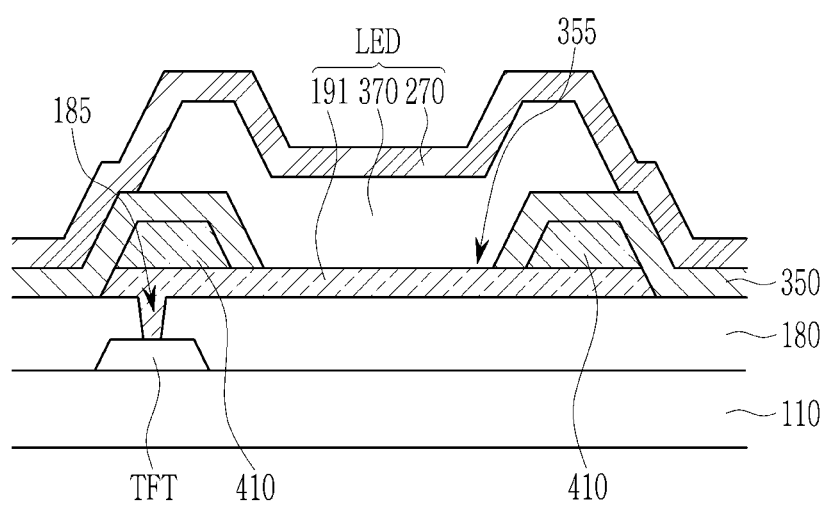
FIG. 10 is a cross-sectional view showing a display device according to another alternative exemplary embodiment of the invention.

FIG. 10 is a cross-sectional view showing a display device according to another alternative exemplary embodiment of the invention. The exemplary embodiment of the display device shown in FIG. 10 is substantially the same as the exemplary embodiment described above with reference to FIG. 8, except for the height relationship of the partition 350 and the second electrode 270. The same or like elements shown in FIG. 10 have been labeled with the same reference characters as used above to describe the exemplary embodiment of the display device shown in FIG. 8, and any repetitive detailed description thereof will hereinafter be omitted or simplified.

Referring to FIG. 10, in an exemplary embodiment, the second electrode 270 is not disposed within the opening 355 of the partition 350. In such an embodiment, the lowermost surface of the second electrode 270 is disposed above the uppermost surface of the partition 350 or farther from the first substrate 110 than the uppermost surface of the partition 350. In such an embodiment shown in FIG. 10, most of the light emitted laterally in the light-emitting element layer 370 disposed between the first electrode 191 and the second electrode 270 is reflected by the inclined surface of the reflection member 410, thereby improving the light emission efficiency.

Figure 11:
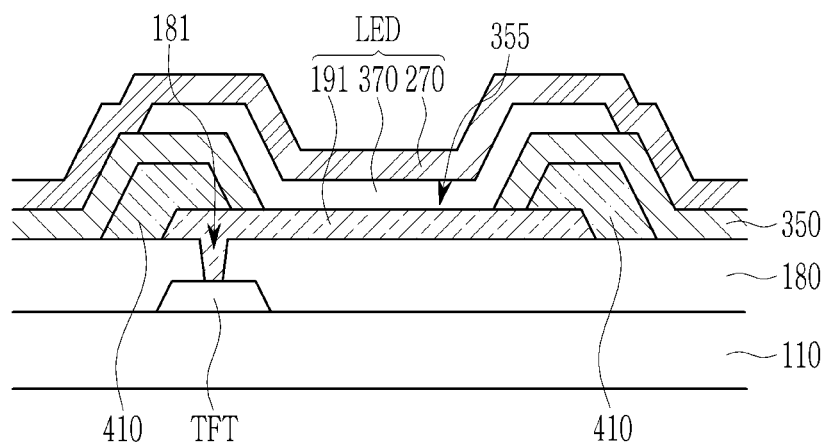
FIG. 11 is a cross-sectional view showing a display device according to another alternative exemplary embodiment of the invention.

FIG. 11 is a cross-sectional view showing a display device according to another alternative exemplary embodiment of the invention. The exemplary embodiment of the display device shown in FIG. 11 is substantially the same as the exemplary embodiment described above with reference to FIG. 8, except for the configuration of the reflection member 410 and the first electrode 191. The same or like elements shown in FIG. 11 have been labeled with the same reference characters as used above to describe the exemplary embodiment of the display device shown in FIG. 8, and any repetitive detailed description thereof will hereinafter be omitted or simplified.

Referring to FIG. 11, in an exemplary embodiment of the display device, the side surface edge of the reflection member 410 and the side surface edge of the first electrode 191 are not aligned with each other. In such an embodiment, as shown in FIG. 11, the reflection member 410 includes a region that does not overlap the first electrode 191 in the direction perpendicular to the first substrate 110 or the thickness direction of the first substrate 110. This structure may be formed when the first electrode 191 and the reflection member 410 are formed in separate processes.

In such an embodiment, the reflection member 410 is substantially the same as that described above with reference to FIG. 8. In such an embodiment, the side surface of the reflection member 410 may be inclined. The light emitted to the side surface of the light-emitting element layer 370 may be reflected by the reflection member 410 to increase the light emission efficiency. The reflection member 410 may include a metal. The reflection member 410 may have a single layer structure or a multi-layer structure. In one exemplary embodiment, for example, the reflection member 410 may have a triple layer structure of Ti/Al/Ti or Mo/Al/Mo. Alternatively, the reflection member 410 may have a dual layer structure of Ti/Cu. However, the material of the reflection member 410 is not limited to the above-described material, and any metal with the reflection property may be used without limitation.

In such an embodiment, the partition 350 is substantially the same as that described above with reference to FIG. 8. In such an embodiment, the partition 350 may include an organic material or an inorganic material. The partition 350 may include an inorganic material containing silicon. In one exemplary embodiment, for example, the partition 350 may include at least one selected from SiOx, SiNx, SiON, and siloxane. In such an embodiment, the partition 350 may further include carbon in the inorganic material containing silicon.

In a case where the partition 350 includes the inorganic material including Si, the absorption for the light of lower wavelengths is relatively low compared with a case where the partition 350 includes the organic materials. In an exemplary embodiment, the partition 350 includes an inorganic material having a low light absorption, such that the amount that the light reflected from the reflection member 410 is absorbed to the partition 350 is reduced, thereby increasing the light emission efficiency.

The refractive index of the partition 350 may be similar to that of the light-emitting element layer 370. In one exemplary embodiment, for example, the refractive index difference between the partition 350 and the light-emitting element layer 370 may be about 50% or less. In such an embodiment, as above-described, the refractive index of the partition 350 is similar to that of the light-emitting element layer 370, such that the light reflected from the reflection member 410 may easily exit the interface of the partition 350 and the light-emitting element layer 370.

Figure 12:
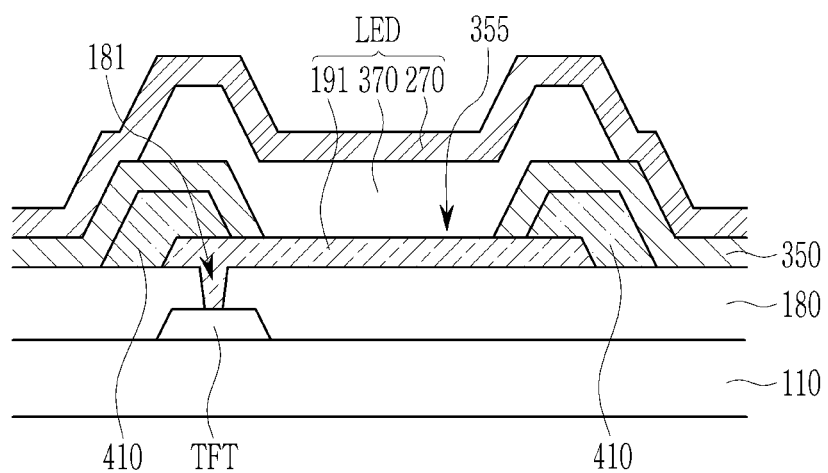
FIG. 12 is a cross-sectional view showing a display device according to another alternative exemplary embodiment of the invention.

FIG. 12 is a cross-sectional view showing a display device according to another alternative exemplary embodiment of the invention. Referring to FIG. 12, the display device according to the exemplary embodiment is the same as that the exemplary embodiment of FIG. 11, except for the height relationship of the partition 350 and the second electrode 270. The same or like elements shown in FIG. 12 have been labeled with the same reference characters as used above to describe the exemplary embodiment of the display device shown in FIG. 11, and any repetitive detailed description thereof will hereinafter be omitted or simplified.

Referring to FIG. 12, in an exemplary embodiment, the upper surface of the partition 350 and the lower surface of the second electrode 270 may be disposed at a same height or level from an upper surface of the first substrate 110. In such an embodiment, the upper surface of the partition 350 adjacent to the opening of the partition 350 and the lower surface of the second electrode 270 disposed at the opening may be positioned on an imaginary horizontal line or plane parallel to the first substrate 110. In such an embodiment where the upper surface of the partition 350 and the lower surface of the second electrode 270 are disposed at a same height as each other, most of the light emitted from the light-emitting element layer 370 disposed between the first electrode 191 and the second electrode 270 to the side surface is reflected by the inclined surface of the reflection member 410, thereby increasing the light emitting efficiency.

Figure 13:
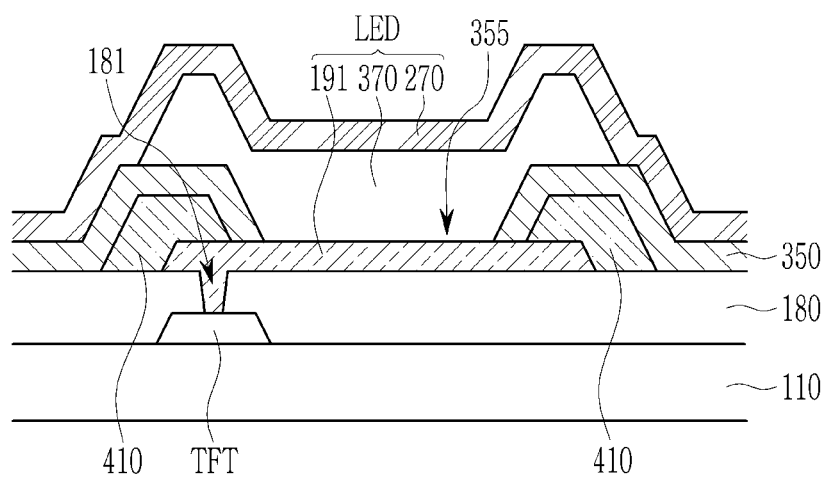
FIG. 13 is a cross-sectional view showing a display device according to another alternative exemplary embodiment of the invention.

FIG. 13 is a cross-sectional view showing a display device according to another alternative exemplary embodiment of the invention. The exemplary embodiment of the display device shown in FIG. 13 is substantially the same as that of the exemplary embodiment described above with reference to FIG. 11, except for the height relation of the partition 350 and the second electrode 270. The same or like elements shown in FIG. 13 have been labeled with the same reference characters as used above to describe the exemplary embodiment of the display device shown in FIG. 11, and any repetitive detailed description thereof will hereinafter be omitted or simplified.

Referring to FIG. 13, in an exemplary embodiment, the second electrode 270 is not disposed within the opening 355 of the partition 350. In such an embodiment, the lowermost surface of the second electrode 270 overlapping the opening 355 is disposed above the uppermost surface of the partition 350 or farther from the first substrate 110 than the uppermost surface of partition 350. In such an embodiment shown in FIG. 13, most of the light emitted laterally in the light-emitting element layer 370 disposed between the first electrode 191 and the second electrode 270 is reflected by the inclined surface of the reflection member 410, thereby improving the light emission efficiency.

Hereinafter, another alternative exemplary embodiment of a display device according to the invention will be described with reference to FIG. 14.

Figure 14:
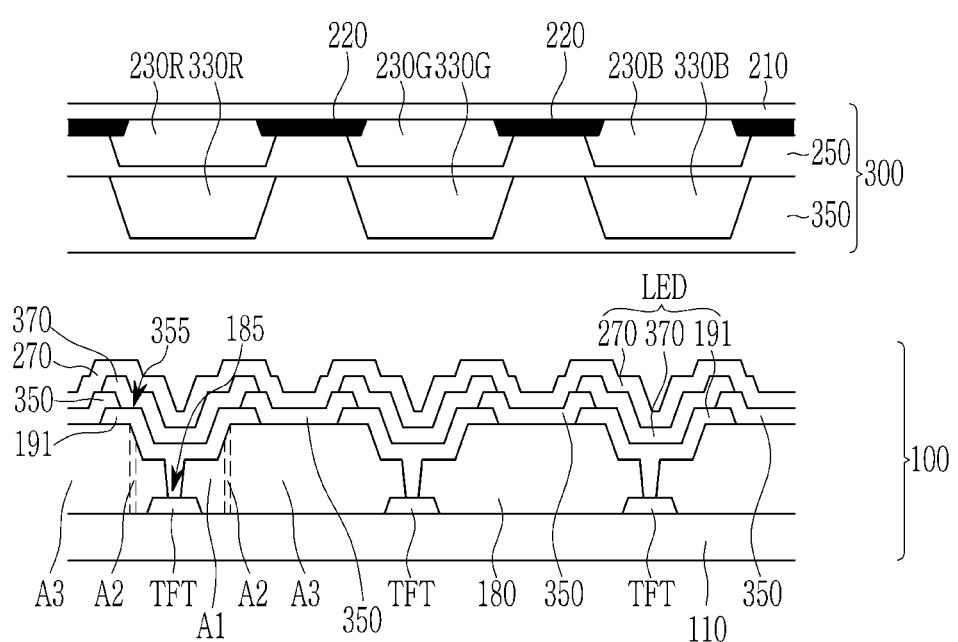
FIG. 14 is a cross-sectional view showing a display device according to another alternative exemplary embodiment of the invention.

FIG. 14 is a cross-sectional view showing a display device according to another alternative exemplary embodiment of the invention. Referring to FIG. 14, an exemplary embodiment of the display device includes a display substrate 100 and a color conversion substrate 300.

The display substrate 100 includes a first substrate 110, a plurality of transistors TFT disposed on the first substrate 110, and an insulating layer 180. The first electrode 191 and the partition 350 are disposed in the insulating layer 180, and the first electrode 191 is disposed in the opening 355 of the partition 350 and is connected to the transistor TFT. The second electrode 270 is disposed on the partition 350, and the light-emitting element layer 370 is disposed between the first electrode 191 and the second electrode 270. The first electrode 191, the second electrode 270, and the light-emitting element layer 370 are collectively referred to as a light-emitting element LED.

In such an embodiment, the insulating layer 180 and the light-emitting element LED is the same as those described above. In such an embodiment, the insulating layer 180 includes a first region A1, a third region A3 disposed higher than the first region A1, and a second region A2 having the inclined surface connecting the first region A1 and the third region A3.

The first electrode 191 disposed in the second region A2 reflects the light emitted from the light-emitting element layer 370 to the side surface, thereby increasing the light emission efficiency. In such an embodiment, the partition 350 includes an inorganic material, and particularly includes an inorganic material including Si such that the light reflected from the first electrode 191 is effectively transmitted, thereby increasing the light emission efficiency.

In FIG. 14, the display substrate 100 has the structure corresponding to that shown in FIG. 1, the structure of the display substrate 100 is not limited thereto, and the display substrate 100 may be variously modified to have any structure of the exemplary embodiments shown in FIGS. 3 and 4, FIG. 5 to FIG. 7, FIG. 8 to FIG. 10, or FIG. 11 to FIG. 13.

The light-emitting element layer 370 may emit a blue light. In such an embodiment, the light-emitting element LED emitting the blue light has any structure described above with reference to FIG. 1, FIG. 3, FIG. 4, and FIG. 5 to FIG. 13, such that the light emission efficiency of the blue light may be increased as described above.

A light blocking member 220 is disposed on a second substrate 210. The light blocking member 220 may be disposed overlapping the partition 350 of the first substrate 110.

A plurality of color filters 230R, 230G, and 230B is disposed between the light blocking members 220. Each of the color filters 230R, 230G, and 230B is disposed between two adjacent light blocking members 220.

A color filter insulating layer 250 is disposed on the color filter 230 and the light blocking member 220. Color conversion layers 330R and 330G and a transmission layer 330B are disposed on the color filter insulating layer 250. In an exemplary embodiment, the color filter insulating layer 250 is disposed between the color conversion layers 330R and 330G and the transmission layer 330B, and the color filters 230R, 230G, and 230B. The color conversion layers 330R and 330G and the transmission layer 330B may be disposed overlapping the color filters 230R, 230G, and 230B, respectively.

The color conversion layers 330R and 330G include quantum dots, and convert the incident light into a light of different color. The color conversion layers 330R and 330G include a green color conversion layer 330G and a red color conversion layer 330R, which convert the blue light emitted from the light-emitting element layer 370 into green light and red light, respectively. The transmission layer 330B may transmit the blue light as it is.

A planarization layer 350 may be positioned on the color conversion layers 330R and 330G and the transmission layer 330B.

In an exemplary embodiment, the display device includes the display substrate 100 and the color conversion substrate 300, and the light emitted from the display substrate 100 is emitted outside through the color filters 230R, 230G, and 230B after passing through the color conversion layers 330R and 330G or the transmission layer 330B of the color conversion substrate 300.

In an exemplary embodiment of the display device, the insulating layer 180 has a same structure as that of FIG. 1, FIG. 3, and FIG. 4, or further includes the reflection member 410 as shown in FIG. 5 to FIG. 13, thereby having improved light emission efficiency. In such an embodiment, the partition 350 may include the inorganic material including Si, such that the transmittance of the blue light is high when the light-emitting element layer 370 emits the blue light, thereby effective improving the light emission efficiency.

Next, the detailed structure of the display device according to an exemplary embodiment of the invention will described with reference to FIGS. 15 and 16. However, this is merely exemplary, and the structure of the invention is not limited thereto.

Figure 15:
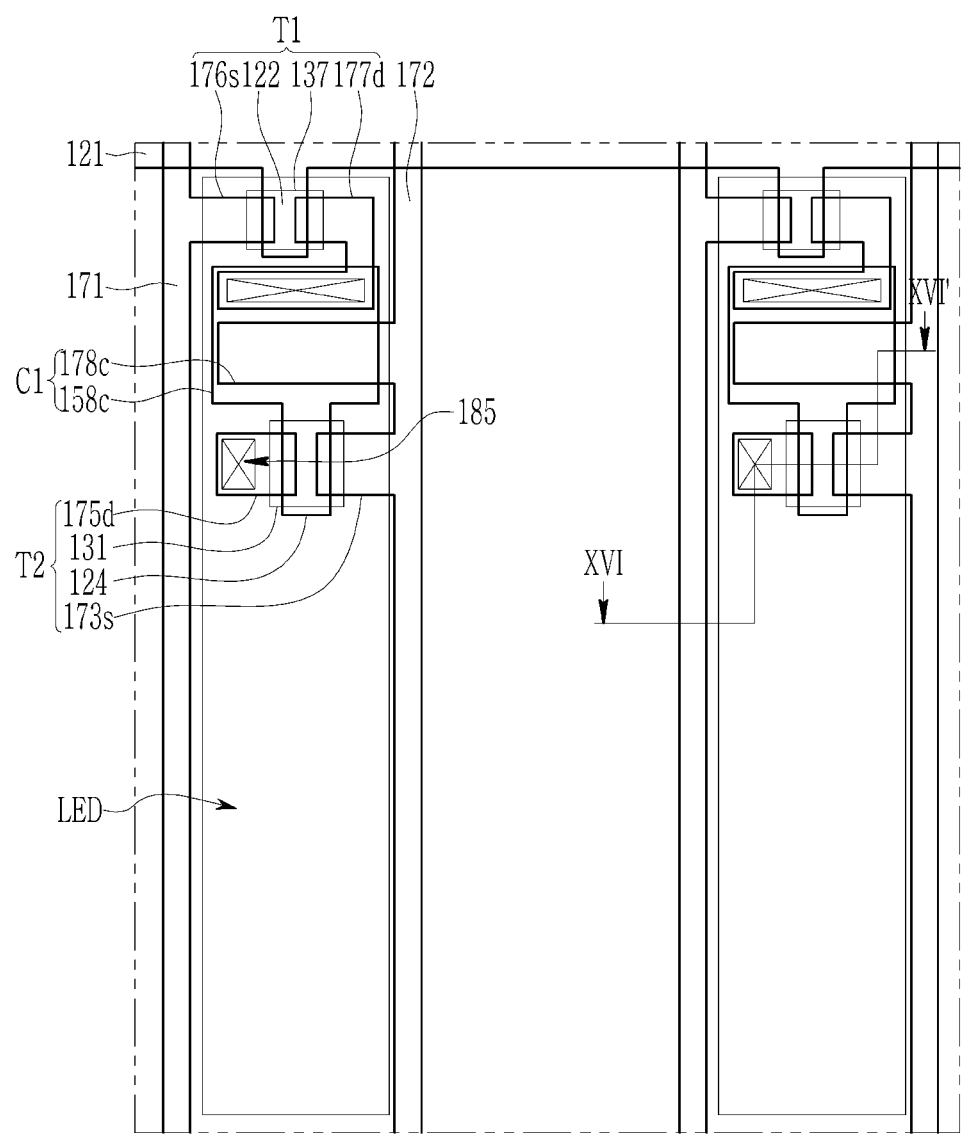
FIG. 15 is a top plan view schematically showing a display panel according to an exemplary embodiment of the invention.

FIG. 15 is a top plan view schematically showing a display panel according to an exemplary embodiment of the invention. FIG. 16 is a cross-sectional view taken along line XVI-XVI' of FIG. 15, In an exemplary embodiment, as shown in FIGS. 15 and 16, the display panel may be an active matrix ("AM") type of light emitting diode display having a two transistor-one capacitor ("2Tr-1Cap") structure including two thin film transistors T1 and T2 and a single capacitive element C1 in each pixel of the display area, but the invention and the exemplary embodiment are not limited thereto. Alternatively, the light emitting diode display may provide three or more transistors and two or more capacitive elements in one pixel, and separate wiring may be further provided to have a variously modified structure. Here, the pixel is a basic or minimum unit of displaying an image, and the display area displays the image through the plurality of pixels.

Figure 16:
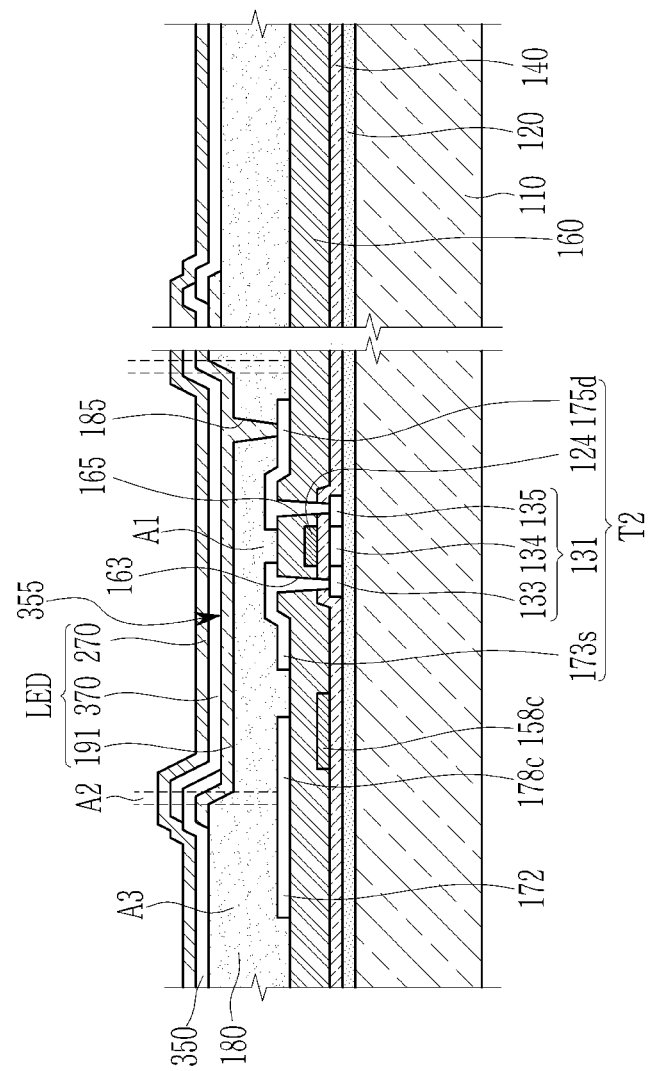
FIG. 16 is a cross-sectional view taken along line XVI-XVI' of FIG. 15.

Referring to FIG. 15 and FIG. 16, an exemplary embodiment of the light emitting diode display includes a switching thin film transistor T1, a driving thin film transistor T2, a capacitive element C1, and a light-emitting element LED, which are respectively formed in a plurality of pixels disposed on the first substrate 110. In such an embodiment, a gate line 121 is disposed along one direction on the first substrate 110, and a data line 171 and a common power source line 172 crossing and insulated from the gate line 121 are disposed on the first substrate 110. In one exemplary embodiment, for example, each pixel may be defined by boundaries of the gate line 121, the data line 171, and the common power source line 172, but not being limited thereto.

The light-emitting element LED includes a first electrode 191, a light-emitting element layer 370 disposed on the first electrode 191, and a second electrode 270 disposed on the light-emitting element layer 370.

In such an embodiment, the first electrode 191 may be an anode of a hole injection electrode, and the second electrode 270 may be a cathode of an electron injection electrode. However, the invention is not limited thereto, and alternatively, the first electrode 191 may be the cathode and the second electrode 270 may be the anode electrode according to a driving method of a light emitting diode display. In an exemplary embodiment, the first electrode 191 may be referred to as a pixel electrode and the second electrode 270 may be referred to as a common electrode.

The light-emitting element layer 370 may include at least one layer selected from a hole injection layer, a hole transferring layer, an emission layer, an electron transferring layer, and an electron injection layer. In such an embodiment, the emission layer may include an organic emission layer, and light is emitted when an exciton generated by combining an injected hole and an electron falls from an excited state to a ground state. Alternatively, the emission layer may include quantum dots.

The capacitive element C1 includes a pair of capacitive plates 158c and 178c disposed via an interlayer insulating layer 160 interposed therebetween. Here, the interlayer insulating layer 160 includes a dielectric material. Capacitance is determined by a charge accumulated in the capacitive element C1 and a voltage between the pair of capacitive plates 158c and 178c.

The switching thin film transistor T1 includes a switching semiconductor layer 137, a switching gate electrode 122, a switching source electrode 176s, and a switching drain electrode 177d. The driving thin film transistor T2 includes a driving semiconductor layer 131, a driving gate electrode 124, a driving source electrode 173s, and a driving drain electrode 175d.

The switching thin film transistor T1 is used as a switching element to select a pixel to emit light therefrom. The switching gate electrode 122 is connected to the gate line 121, and the switching source electrode 176s is connected to the data line 171. The switching drain electrode 177d is disposed to be separated from the switching source electrode 176s and is connected to one capacitive plate 158c.

The driving thin film transistor T2 applies driving power to emit the light-emitting element layer 370 of the light-emitting element LED within the selected pixel to the first electrode 191. The driving gate electrode 124 is connected to the capacitive plate 158c connected to the switching drain electrode 177d. The driving source electrode 173s and the other capacitive plate 178c are connected to the common power source line 172.

The driving drain electrode 175d is connected to the first electrode 191 through the contact hole 185 defined or formed in the insulating layer 180.

In an exemplary embodiment, as shown in FIGS. 15 and 16, the display panel may be an organic light emitting diode display, but not being limited thereto.

A buffer layer 120 is disposed on a first substrate 110. The first substrate 110 may include or be made of at least one material selected from a glass, quartz, a ceramic, a plastic, and the like. The buffer layer 120 may include or be formed of at least one material selected from a silicon nitride (SiNx), a silicon dioxide (SiO$_2$), a silicon oxynitride (SiOxNy) and the like, but not being limited thereto. Here, x and y may be 1 to 5, respectively.

A driving semiconductor layer 131 is disposed on a buffer layer 111. The driving semiconductor layer 131 may include or be formed of at least one of various semiconductor materials such as a polycrystalline silicon film and an amorphous silicon film. The driving semiconductor layer 131 may include a source region 133, a channel region 134, and a drain region 135.

A gate insulating layer 140 including or made of a silicon nitride or a silicon oxide is disposed on the driving semiconductor layer 131. The driving gate electrode 124 and the first capacitive plate 158c are disposed on the gate insulating layer 140. In such an embodiment, the driving gate electrode 124 is disposed to overlap at least a portion of the driving semiconductor layer 131, specifically, the channel region 134.

An interlayer insulating layer 160 covering the driving gate electrode 124 is disposed on the gate insulating layer 140. The interlayer insulating layer 160 may include or be formed of a silicon nitride or a silicon oxide, as the gate insulating layer 140. A first contact hole 163 and a second contact hole 165 may be defined through the gate insulating layer 140 and the interlayer insulating layer 160 to expose the source region 133 and the drain region 135 of the driving semiconductor layer 131, respectively.

A driving source electrode 173s and a driving drain electrode 175d, a data line 171, a common power source line 172, and a second capacitive plate 178c are disposed on the interlayer insulating layer 160. The driving source electrode 173s and the driving drain electrode 175d are connected to the source region 133 and the drain region 135 of the driving semiconductor layer 131 through the first contact hole 163 and the second contact hole 165, respectively.

An insulating layer 180 covering the driving source electrode 173s and the driving drain electrode 175d is disposed on the interlayer insulating layer 160. The insulating layer 180 may include an organic material such as a polyacryl series or a polyimide series.

The partition 350 is disposed on the insulating layer 180, and an opening 355 is defined through the partition 350 by removing a portion thereof. In the opening 355, the light-emitting element layer 370 is disposed overlapping the first electrode 191 and the second electrode 270 is disposed to overlap the light-emitting element layer 370. The light-emitting element layer 370 may include at least one selected from the hole injection layer, the hole transferring layer, the emission layer, the electron transferring layer, and the electron injection layer. The second electrode 270 may be a common electrode. The light-emitting element LED includes the first electrode 191, the light-emitting element layer 370, and the second electrode 270.

In an exemplary embodiment, the partition 350 may include an organic material or an inorganic material. The partition 350 may include an inorganic material including silicon. In one exemplary embodiment, for example, the partition 350 may include at least one material selected from SiOx, SiNx, SiON, and siloxane. In an exemplary embodiment, the partition 350 may further include carbon in the inorganic material including silicon.

Referring to FIG. 16, the insulating layer 180 includes the first region A1, the second region A2, and the third region A3. The first region A1 has a smaller thickness than the third region A3. In such an embodiment, the top surface of the first region A1 is disposed closer to the first substrate 110 than the top surface of the third region A3. The second region A2 has the inclined surface as the part connecting the first region A1 and the third region A3. The first electrode 191 is disposed on the inclined surface of the second region A2, and the first electrode 191 reflects the light emitted from the light-emitting element layer 370 to the side surface to increase the light emission efficiency.

In such an embodiment of FIG. 16 may have improved light emission efficiency as the exemplary embodiment of FIG. 1. In an exemplary embodiment of FIG. 16, the partition 350 may include the inorganic material including Si.

Figure 17:
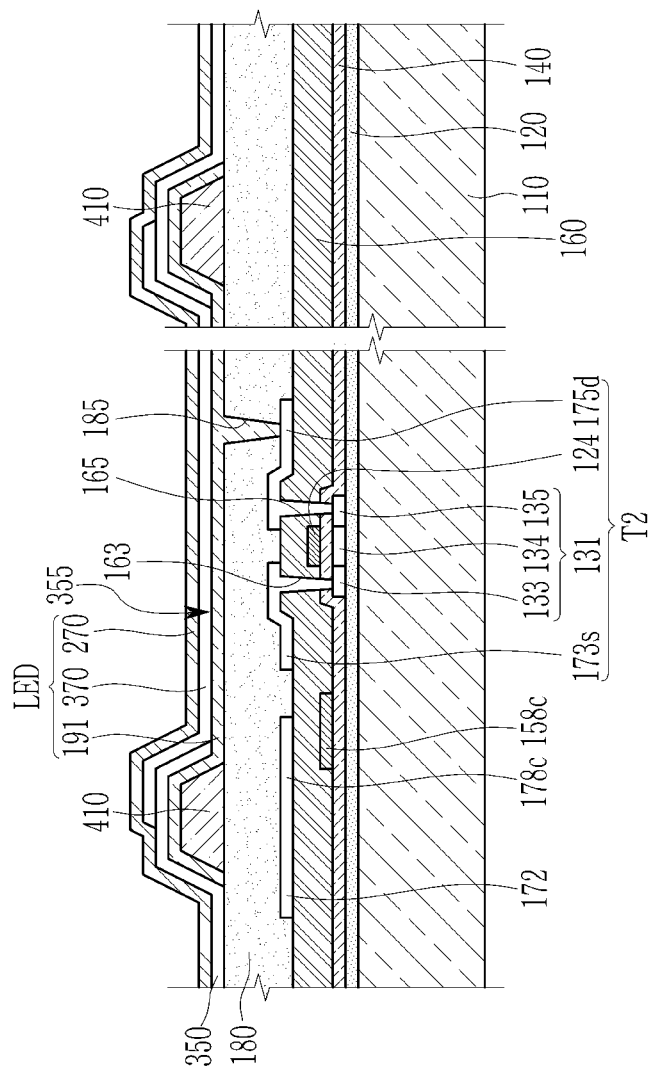
FIG. 17 is a cross-sectional view showing a display device to an alternative exemplary embodiment.

FIG. 17 is a cross-sectional view showing a display device according an alternative exemplary embodiment. Referring to FIG. 17, an exemplary embodiment of the display device further includes a reflection member 410 disposed between the insulating layer 180 and the first electrode 191. The exemplary embodiment of FIG. 17 may correspond to the exemplary embodiment of FIG. 5. The same or like elements shown in FIG. 17 have been labeled with the same reference characters as used above to describe the exemplary embodiment of the display device shown in FIG. 5, and any repetitive detailed description thereof will hereinafter be omitted or simplified.

In an exemplary embodiment, referring to FIG. 17, the side surface of the reflection member 410 may be inclined. The first electrode 191 may be disposed on the upper surface and the inclined side surface of the reflection member 410. Since the first electrode 191 has the side surface inclined along the side surface of the reflection member 410, as in FIG. 16, the light emitted to the side surface of the light-emitting element layer 370 is reflected by the reflection member 410 and the first electrode 191, thereby increasing the light emission efficiency.

Figure 18:
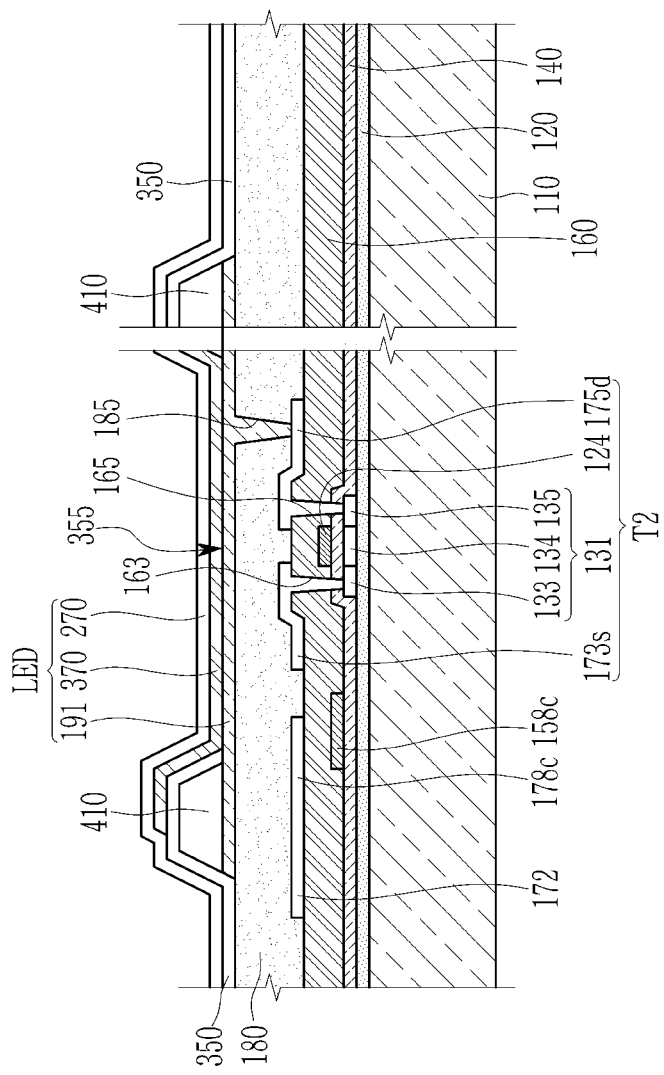
FIG. 18 is a cross-sectional view showing a display device according to another alternative exemplary embodiment.

FIG. 18 is a cross-sectional view showing a display device according another alternative exemplary embodiment. Referring to FIG. 18, an exemplary embodiment of the display device includes the reflection member 410 disposed on the first electrode 191. The exemplary embodiment of FIG. 18 may correspond to the exemplary embodiment of FIG. 8. The same or like elements shown in FIG. 18 have been labeled with the same reference characters as used above to describe the exemplary embodiment of the display device shown in FIG. 8, and any repetitive detailed description thereof will hereinafter be omitted or simplified.

In an exemplary embodiment, the side surface of the reflection member 410 may be inclined. The light emitted to the side surface of the light-emitting element layer 370 is reflected by the reflection member 410 to increase the light emission efficiency.

Referring to FIG. 18, one edge of the reflection member 410 and one edge of the first electrode 191 may be disposed on a same plane. In such an embodiment, one side surface of the reflection member 410 and one side surface of the first electrode 191 may form a same inclined surface.

Figure 19:
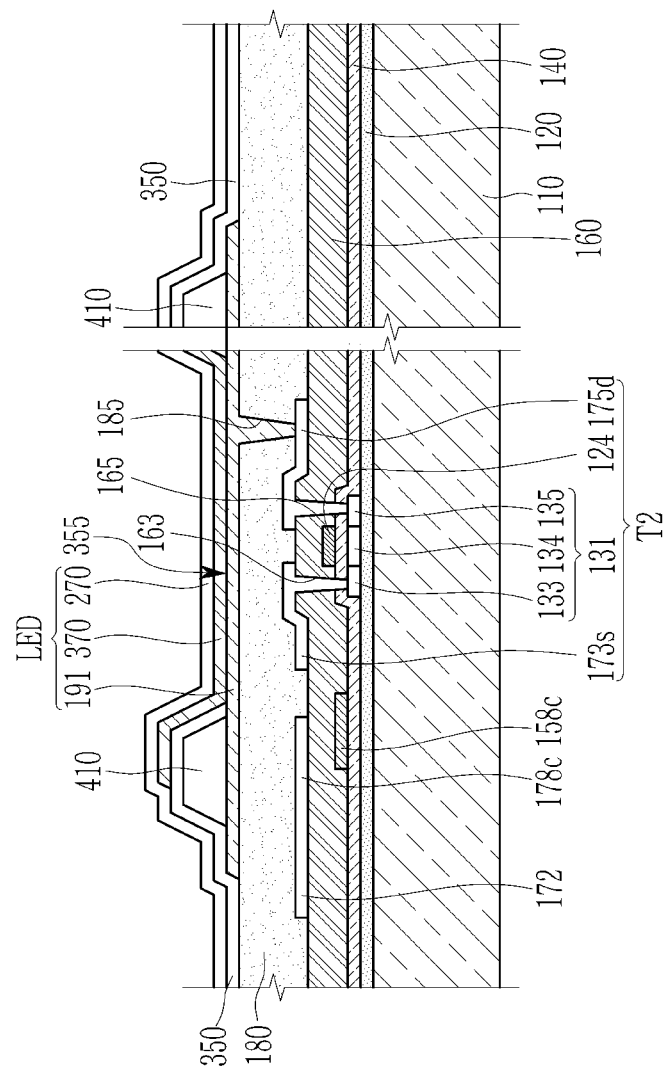
FIG. 19 is a cross-sectional view showing a display device according to another alternative exemplary embodiment.

FIG. 19 is a cross-sectional view showing a display device according another alternative exemplary embodiment. The display device shown in FIG. 19 is substantially the same as the exemplary embodiment of FIG. 18, except for an alignment of the side surface edge of the reflection member 410 and the side surface edge of the first electrode 191. The same or like elements shown in FIG. 19 have been labeled with the same reference characters as used above to describe the exemplary embodiment of the display device shown in FIG. 18, and any repetitive detailed description thereof will hereinafter be omitted or simplified.

Next, a detailed structure of the display device according to another alternative exemplary embodiment of the invention will be described in detail with reference to FIGS. 20 to 25. However, this is merely exemplary, and the structure of the invention is not limited thereto.

Figure 20:
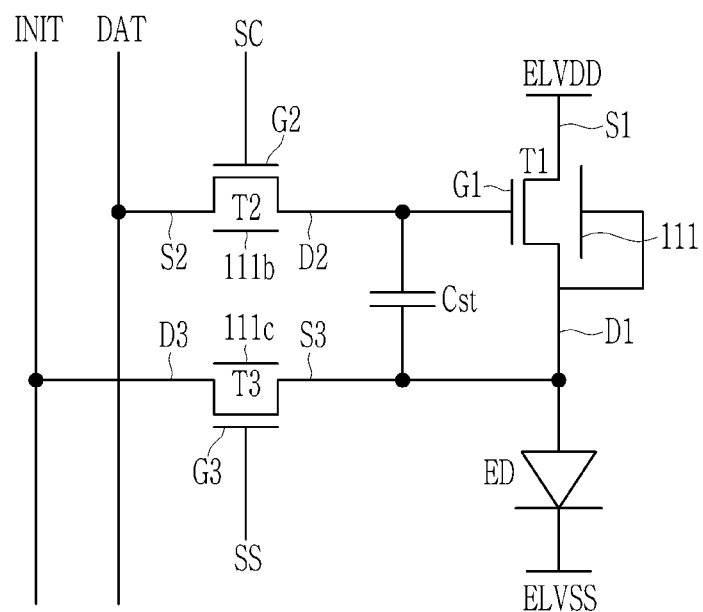
FIG. 20 is a circuit diagram of a pixel of a display device according to an exemplary embodiment.

FIG. 20 is a circuit diagram for a pixel of a display device according to an exemplary embodiment.

Referring to FIG. 20, an exemplary embodiment of the display device may include a plurality of pixels, and one pixel may include a plurality of transistors T1, T2, and T3, a capacitor Cst, and at least one light emitting diode ED. In an exemplary embodiment, as shown in FIG. 20, one pixel includes a single light emitting diode ED, for example, but not being limited thereto.

The plurality of transistors T1, T2, and T3 include a first transistor T1, a second transistor T2, and a third transistor T3. The source electrode and the drain electrode, which are described below, may refer to two electrodes disposed on opposite sides of a channel of each of the transistors T1, T2, and T3, and may be interchangeably used.

The gate electrode G1 of the first transistor T1 is connected to one terminal of the capacitor Cst, the source electrode S1 of the first transistor T1 is connected to the driving voltage line that transmits the driving voltage ELVDD, and the drain electrode D1 of the first transistor T1 is connected to the anode of the light emitting diode ED and the other terminal of the capacitor Cst. The first transistor T1 receives the data voltage DAT according to the switching operation of the second transistor T2, and supplies the driving current corresponding to the voltage stored in the capacitor Cst to the light emitting diode ED.

The gate electrode G2 of the second transistor T2 is connected to a first scan line that transmits a first scan signal SC, the source electrode S2 of the second transistor T2 is connected to a data line that transmits a data voltage DAT or a reference voltage, and the drain electrode D2 of the second transistor T2 is connected to one terminal of the capacitor Cst and the gate electrode G1 of the first transistor T1. The second transistor T2 may be turned on in response to the first scan signal SC to transmit the reference voltage or the data voltage DAT to the gate electrode G1 of the first transistor T1 and one terminal of the capacitor Cst.

The gate electrode G3 of the third transistor T3 is connected to a scan line that transmits a second scan signal SS, the source electrode S3 of the third transistor T3 is connected to the other terminal of the capacitor Cst, the drain electrode D1 of the first transistor T1, and the anode of the light emitting diode ED, and the drain electrode D3 of the third transistor T3 is connected to an initialization voltage line that transmits an initialization voltage INIT. The third transistor T3 may be turned on in response to the second scan signal SS to transmit the initialization voltage INIT to the anode of the light emitting diode ED and the other terminal of the capacitor Cst, thereby initializing the voltage of the anode of the light emitting diode (LED) ED.

One terminal of the capacitor Cst is connected to the gate electrode G1 of the first transistor T1, and the other terminal of the capacitor Cst is connected to the source electrode S3 of the third transistor T3 and the anode of the light emitting diode ED. The cathode of the light emitting diode ED is connected to a common voltage line transmitting a common voltage ELVSS.

The light emitting diode ED may emit light corresponding to a driving current flowing from the first transistor T1 thereto.

An operation of the circuit shown in FIG. 20, particularly the operation during one frame, will hereinafter be described. Here, the operation of an exemplary embodiment where the transistors T1, T2, and T3 are an N-channel transistor will be described, but not being limited thereto.

When one frame starts, in an initialization period, the first scan signal SC of a high level and the second scan signal SS of a high level are supplied to turn on the second transistor T2 and the third transistor T3. The reference voltage from the data line is supplied to the gate electrode G1 of the first transistor T1 and one terminal of the capacitor Cst through the turned-on second transistor T2, and the initialization voltage INIT is supplied to the drain electrode D1 of the first transistor T1 and the anode of the light emitting diode ED through the turned-on third transistor T3. Accordingly, during the initialization period, the drain electrode D1 of the first transistor T1 and the anode of the light emitting diode (ED are initialized to the initialization voltage INIT. At this time, the capacitor Cst stores a voltage difference between the reference voltage and the initialization voltage INIT.

Next, in a sensing period, when the second scan signal SS becomes a low level in a state that the first scan signal SC of a high level is maintained, the second transistor T2 maintains the turn-on state and the third transistor T3 is turned off. The gate electrode G1 of the first transistor T1 and one terminal of the capacitor Cst maintain the reference voltage through the turned-on second transistor T2, and the drain electrode D1 of the first transistor T1 and the anode of the light emitting diode ED are disconnected from the initialization voltage INIT through the turned-off third transistor T3. Accordingly, the first transistor T1 is turned off when the current flows from the source electrode S1 to the drain electrode D1, and then the voltage of the drain electrode D1 becomes a reference voltage or Vth). Vth represents a threshold voltage of the first transistor T1. At this time, the voltage difference between the gate electrode G1 and the drain electrode D1 of the first transistor T1 is stored in the capacitor Cst, and the sensing of the threshold voltage Vth of the first transistor T1 is completed. By generating the data signal that is compensated by reflecting the sensed characteristic information during the sensing period, a characteristic deviation of the first transistor T1 which may be different for each pixel may be externally compensated.

Next, in a data input period, when the first scan signal SC of a high level is supplied and the second scan signal SS of a low level is supplied, the second transistor T2 is turned on and the third transistor T3 is turned off. The data voltage DAT from the data line is supplied to one terminal of the capacitor Cst and the gate electrode G1 of the first transistor T1 via the second turned-on transistor T2. In the data input period, the anode of the drain electrode D1 and the light emitting diode ED of the first transistor T1 may substantially maintain the potential in the sensing period by the first transistor T1 in the turn-off state.

Next, in a light emission period, the first transistor T1 that is turned on by the data voltage DAT transmitted to the gate electrode G1 generates the driving current corresponding to the data voltage DAT, and the light emitting diode (ED may emit light having a luminance corresponding to the driving current.

Figure 21:
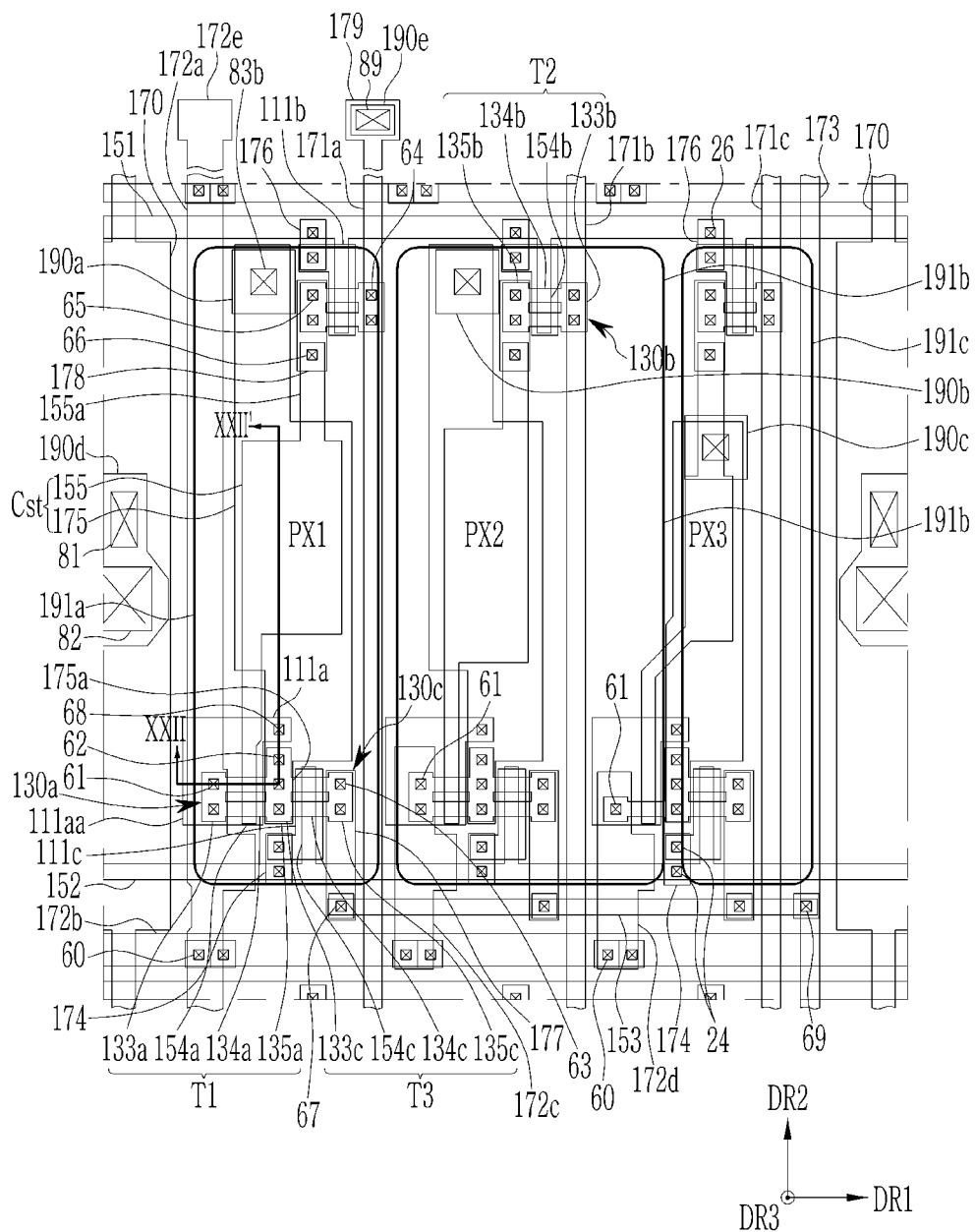
FIG. 21 is a layout view of a plurality of pixels PX1, PX2, and PX3 of a display substrate according to an exemplary embodiment.
Figure 22:
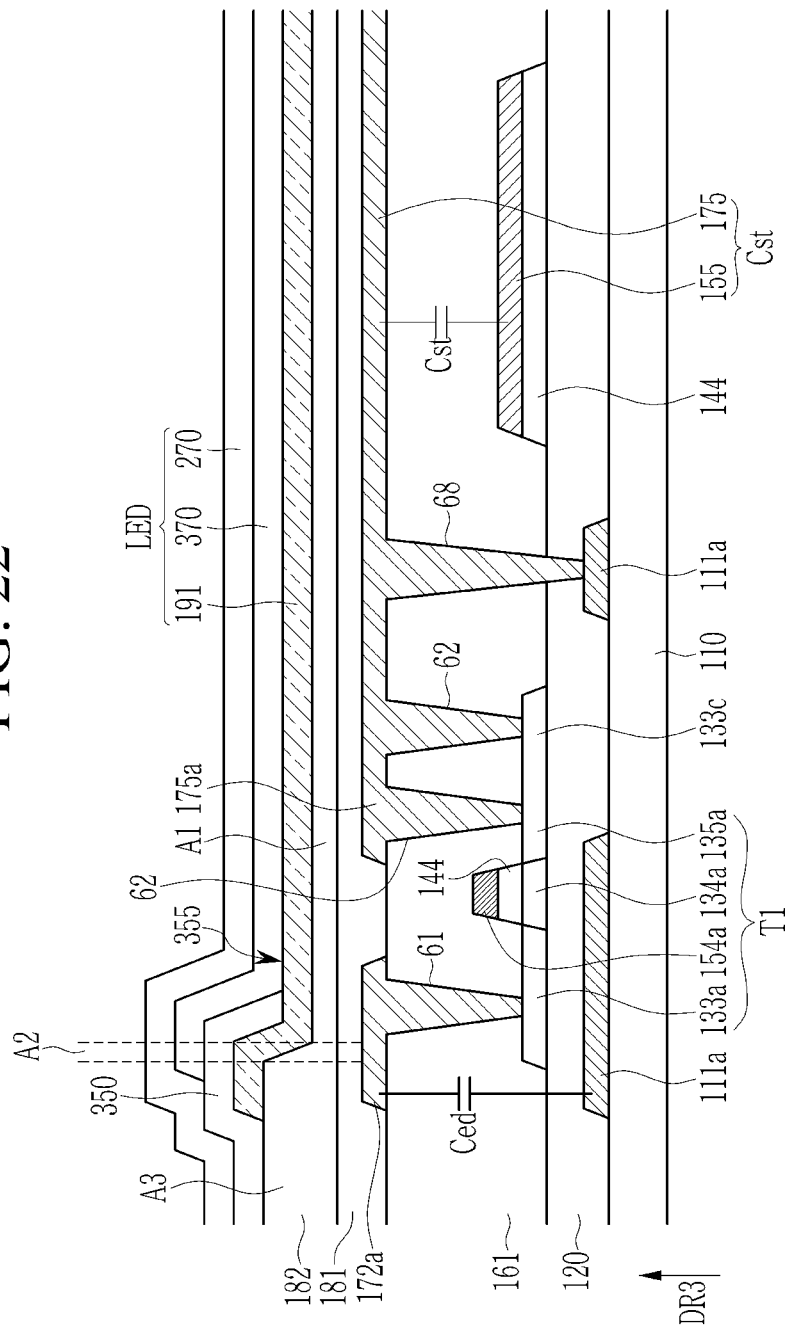
FIG. 22 is a cross-sectional view of a display device shown in FIG. 21 taken along line XXII-XXII'.
Figure 23:
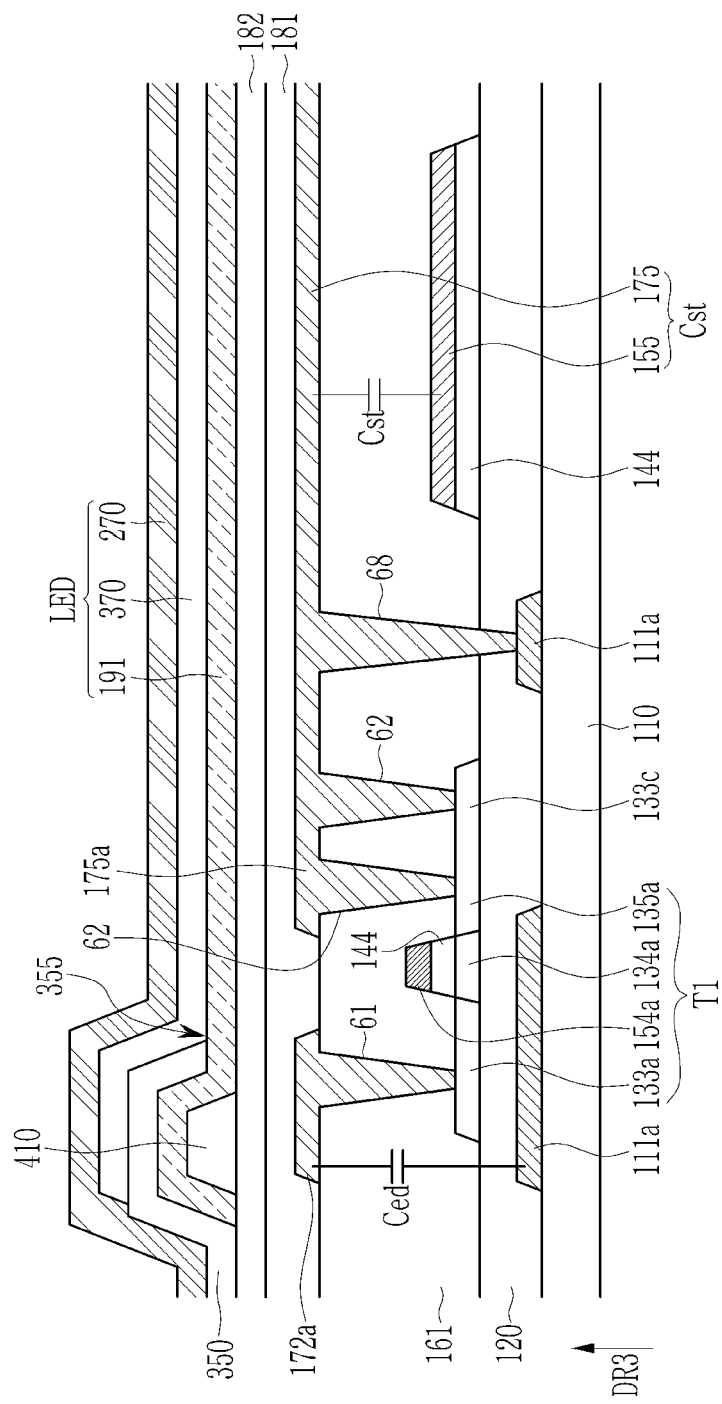
Figure 24:
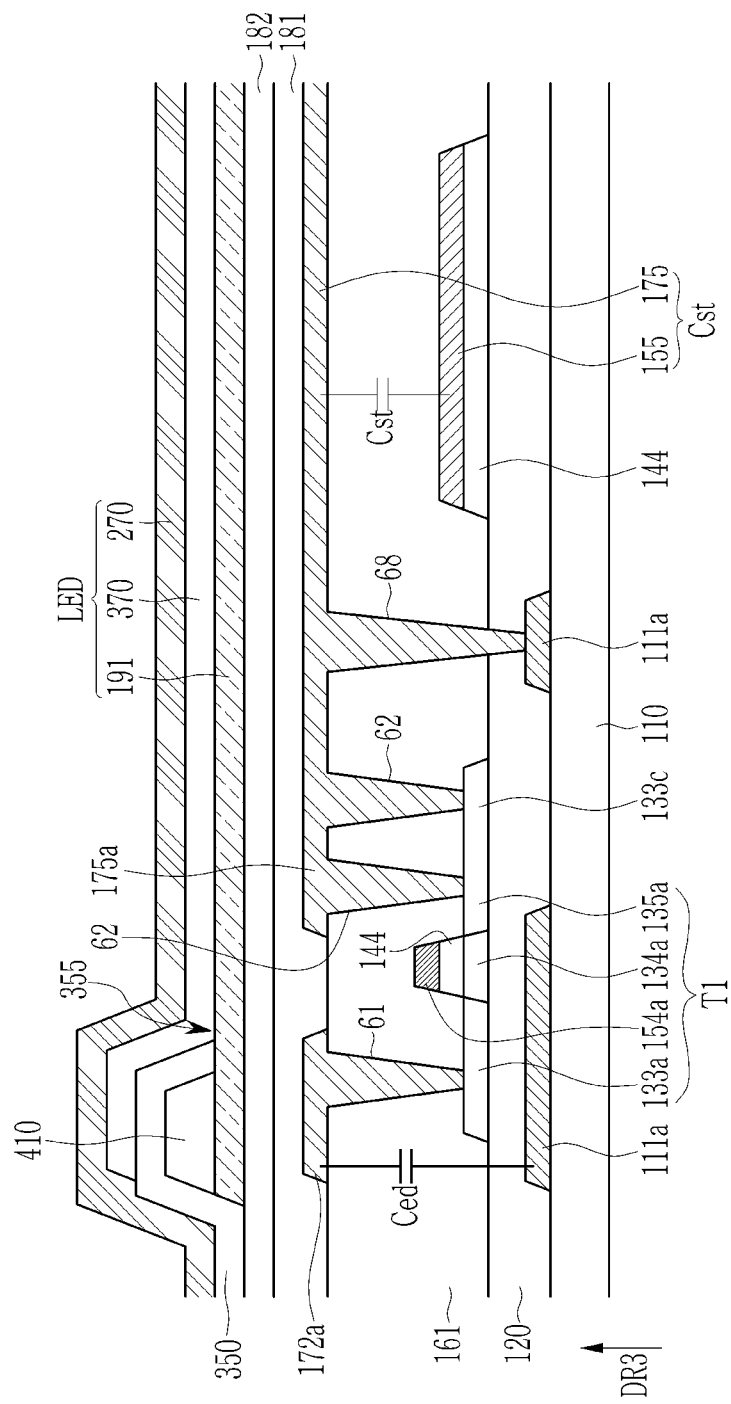

FIG. 21 is a plan layout view of a plurality of pixels PX1, PX2, and PX3 of a display substrate 100 according to an exemplary embodiment, and FIG. 22 is a cross-sectional view of a display device shown in FIG. 21 taken along line XXII-XXII'. FIG. 23 to FIG. 25 are cross-sectional views showing a display device according to alternative exemplary embodiments.

Referring to FIG. 21 and FIG. 22, an exemplary embodiment of the display substrate 100 may include the first substrate 110. The first substrate 110 may include an insulating material, such as glass or plastic, and may have flexibility.

In an exemplary embodiment, a lower layer including a plurality of lower patterns 111a, 111b, and 111c as a first conductive layer is disposed on the first substrate 110. In one exemplary embodiment, for example, a barrier layer (not shown) of an insulating layer may be disposed between the first substrate 110 and the lower layer The lower layer is conductive, and may include a semiconductor material including at least one selected from various conductive metals or having conductive characteristics similar thereto. Alternatively, the lower layer may be omitted.

A buffer layer 120 of an insulating layer is disposed on the lower layer. In such an embodiment, the lower layer may be disposed between the first substrate 110 and the buffer layer 120.

An active layer including a plurality of active patterns 130a, 130b, and 130c is disposed on the buffer layer 120. in such an embodiment, the lower layer may be disposed between the first substrate 110 and the active layer. The active patterns 130a, 130b, and 130c disposed in each pixel PX1, PX2, and PX3 may include a channel region 134a, 134b, and 134c forming each channel of the plurality of transistors T1, T2, and T3 described above, and a conductive region connected thereto. The conductive region of the active patterns 130a, 130b, and 130c includes a source region 133a, 133b, and 133c and a drain region 135a, 135b, and 135c of each transistor T1, T2, and T3. In each pixel PX1, PX2, and PX3, the active pattern 130a and the active pattern 130c may be connected to each other.

The active layer may include a semiconductor material such as an amorphous silicon, a polysilicon, or an oxide semiconductor.

An insulating pattern 144 of a first insulating layer is disposed on the active layer. In an exemplary embodiment, the insulating pattern 144 overlaps the channel regions 134a, 134b, and 134c of the active patterns 130a, 130b, and 130c, and may be disposed on the channel regions 134a, 134b, and 134c. The insulating pattern 144 may not substantially overlap the conductive region of the active patterns 130a, 130b, and 130c.

A second conductive layer may be disposed on the insulating pattern 144. The second conductive layer may include a first scan line 151 that transmits the first scan signal SC as described above, a second scan line 152 that transmits the second scan signal SS, a transverse initialization voltage line 153 that transmits the initialization voltage INIT, a transverse driving voltage line 172b that transmits the driving voltage ELVDD, a driving gate electrode 155, a second gate electrode 154b, a third gate electrode 154c, and the like. The gate electrode G1, the gate electrode G2, and the gate electrode G3 in the above-described circuit diagram respectively correspond to a first gate electrode 154a, the second gate electrode 154b, and the third gate electrode 154c.

The first and second scan lines 151 and 152, the transverse initialization voltage line 153, and the transverse driving voltage line 172b may extend in a first direction DR1, respectively. The driving gate electrode 155 may be disposed between the first scan line 151 and the second scan line 152. The second gate electrode 154b is connected to the first scan line 151, and may have a shape that is protruded downwardly from the first scan line 151. The third gate electrode 154c is connected to the second scan line 152, and may have a shape that is protruded upwardly from the second scan line 152.

The driving gate electrode 155 disposed in each pixel PX1, PX2, and PX3 may include an extension 155a protruded upwardly and extending substantially in a second direction DR2 crossing the first direction DR1, and the first gate electrode 154a protruded downwardly and extending substantially in the second direction DR2. The first gate electrode 154a disposed in the pixel PX3 may be folded at least twice at a portion connected to the driving gate electrode 155. Herein, a third direction DR3 may be a direction perpendicular to the first direction DR1 and the second direction DR2.

The first gate electrode 154a crosses the active pattern 130a and overlaps the channel region 134a of the active pattern 130a. The second gate electrode 154b crosses the active pattern 130b and overlaps the channel region 134b of the active pattern 130b. The third gate electrode 154c crosses the active pattern 130c and overlaps the channel region 134c of the active pattern 130c.

A second insulating layer 161 may be disposed on the second conductive layer. In an exemplary embodiment, a plurality of contact holes 24, 26, 60, 61, 62, 63, 64, 65, 66, 67, 68, and 69 may be defined through the buffer layer 120 and/or the second insulating layer 161.

A third conductive layer may be disposed on the second insulating layer 161. The third conductive layer may include a plurality of data lines 171a, 171b, and 171c, a driving voltage line 172a, a common voltage line 170, an initialization voltage line 173, a capacitor electrode 175, a plurality of connecting members 174, 176, 177, and 178, and a plurality of driving voltage patterns 172c and 172d.

The data lines 171a, 171b, and 171c, the driving voltage line 172a, the common voltage line 170, the initialization voltage line 173, and the driving voltage patterns 172c and 172d extend substantially in the second direction DR2 to be elongated, thereby crossing the first scan line 151 and/or the second scan line 152.

A plurality of pixels PX1, PX2, and PX3 of one group shown and repeated in FIG. 21 may be repeatedly arranged in the first direction DR1 and adjacent to each other. The common voltage line 170 may be disposed at both of right and left sides of the plurality of pixels PX1, PX2, and PX3 of one group. In an exemplary embodiment, the common voltage line 170 may be provided for each of a plurality of pixels PX1, PX2, and PX3 of one repeated group. In an exemplary embodiment, where the plurality of pixels PX1, PX2, and PX3 of one repeated group include three pixels PX1, PX2 and PX3, the data lines 171a, 171b, and 171c, at least one driving voltage line 172a and at least one initialization voltage line 173 may be disposed between two adjacent common voltage lines 170.

Each data line 171a, 171b, and 171c is electrically connected to the source region 133b of the active pattern 130b through at least one contact hole 64 (FIG. 21 shows two contact holes 64 in each pixel PX1, PX2, and PX3) of the second insulating layer 161.

FIG. 21 shows one data line 171a, and each of the data lines 171a, 171b, and 171c may include an end portion 179. The end portion 179 may be disposed in a pad region disposed at the edge of the display device.

The driving voltage line 172a may be disposed in one pixel, for example, the pixel PX1, and the driving voltage patterns 172c and 172d may be disposed in the other pixels PX2 and PX3, respectively. Each driving voltage line 172a may extend in the second direction DR2 to extend adjacent to the plurality of pixels. In such an embodiment, the driving voltage line 172a may include an end portion 172e disposed in the pad region as the data line 171a.

The driving voltage line 172a and the driving voltage patterns 172c and 172d are electrically connected to the source region 133a of the active pattern 130a through at least one contact hole 61 (FIG. 2 shows two contact holes 61 of the pixels PX1 and PX2 and one contact hole 61 of the pixel PX3) of the second insulating layer 161. In such an embodiment, the driving voltage line 172a and the driving voltage patterns 172c and 172d are electrically connected to the transverse driving voltage line 172b through at least one contact hole 60 (FIG. 2 shows two contact holes 60 of each pixel PX1, PX2, and PX3) of the second insulating layer 161. Therefore, the transverse driving voltage line 172b and the driving voltage patterns 172c and 172d may transmit the driving voltage ELVDD together with the driving voltage line 172a, and the driving voltage ELVDD in the entire display device may be transmitted in a mesh shape in both of the first direction DR1 and the second direction DR2.

The initialization voltage line 173 is electrically connected to the transverse initialization voltage line 153 through the contact hole 69 of the second insulating layer 161. Therefore, the transverse initialization voltage line 153 may transfer the initialization voltage INIT along with the initialization voltage line 173, and even if the initialization voltage line 173 is provided for each of the three pixels PX1, PX2, and PX3, the initialization voltage INIT may be transmitted to all pixels PX1, PX2, and PX3 through the transverse initialization voltage line 153.

The capacitor electrode 175 may be included in each pixel PX1, PX2, and PX3. The capacitor electrode 175 may overlap the corresponding driving gate electrode 155 via the second insulating layer 161 therebetween, thereby forming the capacitor Cst.

The capacitor electrode 175 may include a connection 175a protruded downwardly. The connection 175a is electrically connected to the drain region 135a of the active pattern 130a and the source region 133c of the active pattern 130c connected thereto through at least one contact hole 62 (FIG. 2 shows three contact holes 62 of each pixel PX1, PX2, and PX3) of the second insulating layer 161. in such an embodiment, the capacitor electrode 175 is electrically connected to the lower pattern 111a via the contact hole 68 of the second insulating layer 161 and the buffer layer 120.

The connecting member 174 is electrically connected to the second scan line 152 and the lower pattern 111c via two contact holes 24 of the buffer layer 120 and the second insulating layer 161, or a contact hole defined only through the second insulating layer 161, thereby electrically connecting the second scan line 152 and the lower pattern 111c.

The connecting member 176 is electrically connected to the first scan line 151 and the lower pattern 111b via two contact holes 26 of the buffer layer 120 and the second insulating layer 161, or a contact hole defined only through the second insulating layer 161, thereby electrically connecting the first scan line 151 and the lower pattern 111b.

The connecting member 177 is electrically connected to the drain region 135c of the active pattern 130c via at least one contact hole 63 (FIG. 2 shows two contact holes 63 in each pixel PX1, PX2, and PX3) of the second insulating layer 161 in each pixel PX1, PX2, and PX3, and is electrically connected to the transverse initialization voltage line 153 via the contact hole 67 of the second insulating layer 161, such that the drain region 135c of the active pattern 130c may be electrically connected to the transverse initialization voltage line 153.

The transverse initialization voltage line 153 extends in the first direction DR1 throughout three pixels PX1, PX2, and PX3. Alternatively, the transverse initialization voltage line 153 may be disposed between two adjacent common voltage lines 170 and not cross the two common voltage lines 170. The transverse initialization voltage line 153 crosses three adjacent data lines 171a, 171b, and 171c, and may extend to the initialization voltage line 173.

The connecting member 178 is electrically connected to the drain region 135b of the active pattern 130b via at least one contact hole 65 (FIG. 2 shows two contact holes 65 in each pixel PX1, PX2, and PX3) of the second insulating layer 161 in each pixel PX1, PX2, and PX3, and is electrically connected to the extension 155a of the driving gate electrode 155 via the contact hole 66 of the second insulating layer 161, thereby the drain region 135b of the active pattern 130b and the extension 155a of the driving gate electrode 155 may be electrically connected to each other.

At least one layer selected from the first conductive layer, the second conductive layer, and the third conductive layer may include at least one metal such as copper (Cu), aluminum (Al), magnesium (Mg), silver (Ag), gold (Au), platinum (pt), palladium (Pd), nickel (Ni), neodymium (Nd), iridium (Ir), molybdenum (Mo), tungsten (W), titanium (Ti), chromium (Cr), tantalum (Ta), alloys thereof, and the like. Each of the first conductive layer, the second conductive layer, and the third conductive layer may have a single layer structure or a multi-layer structure.

In one exemplary embodiment, for example, the third conductive layer may have a multilayer structure including an underlying layer including titanium and an overlying layer including copper.

The first transistor T1 includes the channel region 134a, the source region 133a, the drain region 135a, and the first gate electrode 154a. The source region 133a of the first transistor T1 is electrically connected to the driving voltage line 172a and the driving voltage patterns 172c and 172d, thereby receiving the driving voltage ELVDD.

The lower pattern 111a corresponding to the first transistor T1 overlaps the channel region 134a between the channel region 134a of the first transistor T1 and the substrate 110 to prevent external light from reaching the channel region 134a, thereby reducing a leakage current and a characteristic deterioration. The lower pattern 111a is electrically connected to the drain region 135a of the first transistor T1 through the capacitor electrode 175.

The second transistor T2 includes the channel region 134b, the source region 133b, the drain region 135b, and the second gate electrode 154b. The source region 133b of the second transistor T2 is electrically connected to the data lines 171a, 171b, and 171c, thereby receiving the data voltage DAT or the reference voltage. The drain region 135b of the second transistor T2 may be electrically connected to the first gate electrode 154a through the driving gate electrode 155.

The lower pattern 111b corresponding to the second transistor T2 overlaps the channel region 134b between the channel region 134b of the second transistor T2 and the substrate 110 to prevent the external light from reaching the channel region 134b, thereby reducing the leakage current and the characteristic deterioration. In such an embodiment, the lower pattern 111b, which is electrically connected to the first scan line 151, may define a dual gate electrode of the second transistor T2 or the second gate electrode 154b.

The third transistor T3 includes the channel region 134c, the source region 133c, the drain region 135c, and the third gate electrode 154c. The drain region 135c of the third transistor T3 may receive the initialization voltage INIT from the transverse initialization voltage line 153.

The lower pattern 111c corresponding to the third transistor T3 overlaps the channel region 134c between the channel region 134c of the third transistor T3 and the substrate 110 to prevent the external light from reaching the channel region 134c, thereby reducing the leakage current and the characteristic deterioration. In such an embodiment, the lower pattern 111c, which is electrically connected to the second scan line 152, may define the dual gate electrode of the third transistor T3 or the third gate electrode 154c.

A third insulating layer 181 may be disposed on the second insulating layer 161 and the third conductive layer. The third insulating layer 181 may include a contact hole 83a disposed on the capacitor electrode 175, a contact hole 89a disposed on the end portion 179 of the data lines 171a, 171b, and 171c, and a contact hole 81 disposed on the common voltage line 170.

A fourth conductive layer including a plurality of ohmic contacts 190a, 190b, 190c, 190d, and 190e may be disposed on the third insulating layer 181.

The ohmic contact 190a, 190b, and 190c may be respectively disposed in the pixels PX1, PX2, and PX3 and in contact with the capacitor electrode 175 via the contact hole 83a to be electrically connected. The ohmic contact 190d may be in contact with the common voltage line 170 via the contact hole 81 to be electrically connected. The ohmic contact 190e may be in contact with the end portion 179 of the data lines 171a, 171b, and 171c via the contact hole 89a to be electrically connected.

The ohmic contacts 190a, 190b, 190c, 190d and 190e may improve the adherence of the capacitor electrode 175 of the third conductive layer, the common voltage line 170, and the end portion 179 of the data lines 171a, 171b, and 171c, which are in contact thereto, with other conductive layers, and may prevent oxidation of the third conductive layer. In an exemplary embodiment, the upper layer of the third conductive layer includes copper, such that oxidation of the copper may be prevented by the fourth conductive layer. In such an embodiment, when the upper layer of the third conductive layer includes the conductive material for preventing corrosion of the upper layer of the third conductive layer, for example, copper, the fourth conductive layer may include the conductive material by capping the upper layer of the third conductive layer to prevent the corrosion thereof. In one exemplary embodiment, for example, the fourth conductive layer may include the conductive material of the metal oxide such as indium tin oxide ("ITO"), indium zinc oxide ("IZO"), and the like.

A fourth insulating layer 182 may be disposed on the third insulating layer 181 and the fourth conductive layer. A contact hole 83b may be defined through the fourth insulating layer 182 may include to expose each ohmic contact 190a, 190b, and 190c and overlapping the contact hole 83a, and a contact hole 89b disposed on the ohmic contact 190e and overlapping the contact hole 89a. An opening 355 corresponding to the contact hole 89b may be defined through the partition 350 over the fourth insulating layer 182.

The ohmic contact (contact member) 190e may be exposed by the contact hole 89b, and thereby may be in electrical contact with a separate driving circuit chip, circuit film, or circuit board.

At least one selected from the buffer layer 120, the first insulating layer, the second insulating layer 161, the third insulating layer 181, and the fourth insulating layer 182 may include an inorganic insulating material such as a silicon nitride (SiNx), a silicon oxide (SiOx), and a silicon oxynitride (SiON), and/or an organic insulating material. in an exemplary embodiment, the fourth insulating layer 182 may include the inorganic insulating material and/or the organic insulating material such as a polyimide, an acryl-based polymer, a siloxane-based polymer, or the like, and may have a substantially flat upper surface. The fourth insulating layer 182 will be described later in greater detail.

In an exemplary embodiment, a pixel electrode layer including a plurality of pixel electrodes 191a, 191b, and 191c may be disposed as a fifth conductive layer on the fourth insulating layer 182. The first electrode 191 may include a first pixel electrode 191a, a second pixel electrode 191b, and a third pixel electrode 191c. The pixel electrodes 191a, 191b, and 191c may be disposed corresponding to the pixels PX1, PX2, and PX3, respectively, as shown in FIG. 21.

Planar sizes and shapes of the first pixel electrode 191a, the second pixel electrode 191b, and the third pixel electrode 191c may differ from each other.

In one exemplary embodiment, for example, in the three pixels PX1, PX2, and PX3, a planar size of the second pixel electrode 191b, a planar size of the first pixel electrode 191a, and a planar size of the third pixel electrode 191c may be reduced in that order. In such an embodiment, the pixel PX2 may represent green, the pixel PX1 may represent red, and the pixel PX3 may represent blue.

Alternatively, the planar size of the first pixel electrode 191a may be the largest, and the planar size of the second pixel electrode 191b may be greater than the planar size the third pixel electrode 191c.

The pixel electrodes 191a, 191b, and 191c may respectively be in contact with the ohmic contacts (the contact members) 190a, 190b, and 190c through the contact hole 83b and electrically connected to the capacitor electrode 175 through the ohmic contacts 190a, 190b, and 190c. Accordingly, each pixel electrode 191a, 191b, and 191c is electrically connected to the drain region 135a of the first transistor T1, thereby receiving the voltage from the first transistor T1.

The pixel electrode layer may include a semitransparent conductive material or a reflective conductive material.

The partition 350 may be disposed on the fourth insulating layer 182. The partition 350 has the opening 355 disposed on the pixel electrode 191a, 191b, and 191c. The partition 350 may include an organic material or an inorganic material. In one exemplary embodiment, for example, the partition 350 may include an inorganic material including silicon. The partition 350 may include at least one selected from SiOx, SiNx, SiON, and siloxane. In such an embodiment, the partition 350 may further include carbon in the inorganic material including silicon.

In a case where the partition 350 includes the inorganic material including Si, the absorption of light of lower wavelengths is relatively low compared with a case where the partition 350 includes the organic material. In an exemplary embodiment, the partition 350 includes an inorganic material having a low light absorption, such that the amount that the light reflected by the first electrode 191 disposed in the second region A2 is absorbed to the partition 350 is reduced, thereby increasing the light emission efficiency. to The light-emitting element layer 370 is disposed on the partition 350 and the pixel electrode layer. The light-emitting element layer 370 may include a part disposed within the opening 355 of the partition 350. The light-emitting element layer 370 may include an organic light emission material or an inorganic light emission material.

The second electrode 270 is disposed on the light-emitting element layer 370. The second electrode 270 may be a common electrode. The second electrode 270 may be formed continuously across the plurality of pixels PX1, PX2, and PX3. The second electrode 270 may be electrically connected to the common voltage line 170 by being in contact with the ohmic contact 190d through a contact hole 82, thereby receiving the common voltage ELVSS.

The second electrode 270 may include a conductive transparent material.

The pixel electrodes 191a, 191b, and 191c, the light-emitting element layer 370, and the common electrode 270 of each pixel PX1, PX2, and PX3 collectively define the light emitting diode ED, and one of the pixel electrodes 191a, 191b and 191c, and the common electrode 270 may be the cathode, and the other the pixel electrodes 191a, 191b and 191c, and the common electrode 270 may be the anode. For convenience of description, exemplary embodiments where the pixel electrodes 191a, 191b, and 191c are the anode is described herein.

Referring to FIG. 21, the lower pattern 111a may further include an extension portion 111aa overlapping the driving voltage lines 172a and the driving voltage patterns 172c and 172d in a plan view. Accordingly, the plane size of the lower pattern 111a may be larger than the plane size of the lower pattern 111b or the lower pattern 111c. According to an exemplary embodiment, the lower pattern 111a is electrically connected to the pixel electrodes 191a, 191b, and 191c as the anode via the capacitor electrode 175, and as the extension portion 111aa of the lower pattern 111a overlaps the driving voltage line 172a and the driving voltage patterns 172c and 172d for transmitting a predetermined voltage via the buffer layer 120 and the second insulating layer 161, a capacitor Ced for maintaining the voltage of the anode.

The extension portion 111aa may also overlap the source region 133a of the active pattern 130a connected to the driving voltage line 172a.

In an exemplary embodiment, the lower pattern 111a is electrically connected to the pixel electrodes 191a, 191b, and 191c through the capacitor electrode 175 and also overlaps the channel region 134a of the first transistor T1, and a current variation rate is reduced in a saturation region of a voltage-current characteristic graph of the first transistor T1 so that a range of a region where the output current of the first transistor T1 is constant may be widened. Therefore, even if there is a change in the source-drain voltage Vds of the first transistor T1, the output current of the first transistor T1 is maintained at a constant level, thereby improving the output saturation characteristic. Thus, the luminance deviation between the pixels due to the output current of the first transistor T1 is reduced, thereby improving the image quality.

Referring to FIG. 22, the fourth insulating layer 182 includes the first region A1, the second region A2, and the third region A3. The first region A1 has a smaller thickness than the third region A3. In such an embodiment, the top of the first region A1 is disposed closer to the first substrate 110 than the top of the third region A3. The second region A2 has the inclined surface as the part connecting the first region A1 and the third region A3. The first electrode 191 is disposed on the inclined surface of the second region A2, and the first electrode 191 reflects the light emitted from the light-emitting element layer 370 to the side surface to increase the light emission efficiency.

In an exemplary embodiment of FIG. 22, the partition 350 may include an inorganic material including silicon. In one exemplary embodiment, for example, the partition 350 may include at least one selected from SiOx, SiNx, SiON, and siloxane. In such an embodiment, the partition 350 may further include carbon in the inorganic material including silicon.

In such an embodiment, the display device has a similar structure to that of the exemplary embodiment of FIG. 1 having improved light emission efficiency. Accordingly, any repetitive detailed description thereof will be omitted.

FIG. 23 is a cross-sectional view showing a display device according to another alternative exemplary embodiment. Referring to FIG. 23, an exemplary embodiment of the display device includes the reflection member 410 disposed between the insulating layer 180 and the first electrode 191. The exemplary embodiment of FIG. 23 corresponds to the exemplary embodiment of FIG. 5. The same or like elements shown in FIG. 23 have been labeled with the same reference characters as used above to describe the exemplary embodiment of the display device shown in FIG. 5, and any repetitive detailed description thereof will hereinafter be omitted or simplified.

Referring to FIG. 23, in an exemplary embodiment, the side surface of the reflection member 410 may be inclined. The first electrode 191 may be disposed on the inclined side surface and the flat upper surface of the reflection member 410. Since the first electrode 191 has the inclined side surface along the side surface of the reflection member 410, as in FIG. 22, the light emitted to the side surface of the light-emitting element layer 370 is reflected by the reflection member 410 and the first electrode 191, thereby increasing the light emission efficiency.

FIG. 24 is a cross-sectional view showing the same cross-section as FIG. 22 according to another alternative exemplary embodiment. Referring to FIG. 24, an exemplary embodiment of the display device includes the reflection member 410 disposed on the first electrode 191. The exemplary embodiment of FIG. 24 corresponds to the exemplary embodiment of FIG. 8. The same or like elements shown in FIG. 24 have been labeled with the same reference characters as used above to describe the exemplary embodiment of the display device shown in FIG. 8, and any repetitive detailed description thereof will hereinafter be omitted or simplified.

In such an embodiment, the side surface of the reflection member 410 may be inclined. The light emitted to the side surface of the light-emitting element layer 370 may be reflected by the reflection member 410 to increase the light emission efficiency. Referring to FIG. 24, one edge of the reflection member 410 and one edge of the first electrode 191 may be disposed on a same plane. In such an embodiment, one side surface of the reflection member 410 and one side surface of the first electrode 191 form a same inclined surface. In such an embodiment, the reflection member 410 and the first electrode 191 may be formed by a same process.

FIG. 25 is a cross-sectional view showing a display device according to another alternative exemplary embodiment.

The exemplary embodiment of the display device shown in FIG. 25 is substantially the same as the exemplary embodiment described above with reference to FIG. 24, except that the side edge of the reflection member 410 is not aligned with the side edge of the first electrode 191. The same or like elements shown in FIG. 25 have been labeled with the same reference characters as used above to describe the exemplary embodiment of the display device shown in FIG. 24, and any repetitive detailed description thereof will hereinafter be omitted or simplified.

As described herein, in exemplary embodiments of the display device according to the invention, the insulating layer includes an inclined surface or includes the reflection member including an inclined surface. Accordingly, in such embodiment, the light emission efficiency is increased by reflecting the light emitted to the side surface of the light-emitting element by the first electrode. In such embodiments, the partition includes an inorganic material, such that the transmittance of the light reflected by the first electrode is increased, and the partition includes a material having a refractive index similar to that of the light-emitting element layer, thereby allowing the light reflected by the first electrode to exit through an interface between the light-emitting element layer and the partition. Thus, the light emission efficiency of the display device is increased.

While the invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a transistor disposed on a first substrate;
an insulating layer disposed on the transistor;
a first electrode disposed on the insulating layer;
a partition disposed on the first electrode and the insulating layer, wherein an opening is defined through the partition, and an entire portion of the partition includes an inorganic material including silicon;
a light-emitting element layer disposed in the opening; and
a second electrode disposed on the light-emitting element layer and the partition,
wherein
the insulating layer includes a first region and a third region having different heights from each other and a second region having an inclined surface connecting the first region and the third region,
the first region has a lower height than the third region, and
the first electrode overlaps the first region in a direction perpendicular to the first substrate.

2. The display device of claim 1, wherein
the partition further includes carbon.

3. The display device of claim 1, wherein
the partition includes at least one material selected from SiOx, SiNx, SiON, and siloxane.

4. The display device of claim 1, wherein
a thickness of the partition is in a range of about 1000 Å to about 3000 Å.

5. The display device of claim 1, wherein
a refractive index difference between the partition and the light-emitting element layer is less than about 50% of a refractive index of the partition.

6. The display device of claim 1, wherein
the partition has an inclined surface overlapping the second region.

7. The display device of claim 6, wherein
the first electrode in the second region is disposed between the insulating layer and the partition.

8. The display device of claim 1, wherein
a lowermost surface of the second electrode is closer to the first substrate than an uppermost surface of the partition.

9. The display device of claim 1, wherein
a lower surface of the second electrode is disposed at a same height as an upper surface of the opening of the partition.

10. The display device of claim 1, wherein
an uppermost surface of the partition is disposed closer to the first substrate than a lowermost surface of the second electrode.

11. The display device of claim 1, further comprising:
a second substrate overlapping the first substrate; and
a color conversion layer disposed on the second substrate,
wherein the color conversion layer is disposed overlapping the light-emitting element layer in the direction perpendicular to the first substrate.

12. The display device of claim 11, wherein
the light-emitting element layer emits a blue light.

13. The display device of claim 1, wherein
the partition includes an organic material.

14. A display device comprising:
a transistor disposed on a substrate;
an insulating layer disposed on the transistor;
a first electrode disposed on the insulating layer;
a reflection member disposed between the insulating layer and the first electrode;
a partition disposed on the first electrode and the insulating layer, wherein an opening is defined through the partition;
a light-emitting element layer disposed in the opening; and
a second electrode disposed on the light-emitting element layer and the partition,
wherein a side surface of the reflection member adjacent to the opening includes an inclined surface, and
a shape of a cross-section perpendicular to the substrate of the reflection member is a quadrangle including one or more inclined surfaces.

15. The display device of claim 14, wherein
the reflection member includes a metal.

16. The display device of claim 14, wherein
the reflection member has a multilayer structure of one among Ti/Al/Ti, Mo/Al/Mo, and Ti/Cu.

17. The display device of claim 14, wherein
the first electrode is disposed over the reflection member.

18. The display device of claim 17, wherein
the partition is disposed on the reflection member, and
the first electrode is disposed between the reflection member and the partition on the inclined surface of the reflection member.

19. The display device of claim 14, wherein
a lowermost surface of the second electrode is closer to the substrate than an uppermost surface of the partition.

20. The display device of claim 14, wherein
a lower surface of the second electrode is disposed at a same height as an upper surface of the opening of the partition.

21. The display device of claim 14, wherein
an uppermost surface of the partition is closer to the substrate than a lowermost surface of the second electrode.

22. A display device comprising:
a transistor disposed on a substrate;
an insulating layer disposed on the transistor;
a first electrode disposed on the insulating layer;
a reflection member disposed on the first electrode;
a partition disposed on the first electrode, the reflection member, and the insulating layer, wherein an opening is defined through the partition;
a light-emitting element layer disposed in the opening; and
a second electrode disposed on the light-emitting element layer and the partition,
wherein a side surface of the reflection member adjacent to the opening includes an inclined surface, and
a shape of a cross-section perpendicular to the substrate of the reflection member is a quadrangle including one or more inclined surfaces.

23. The display device of claim 22, wherein
the reflection member includes a metal.

24. The display device of claim 22, wherein
the reflection member has a multilayer structure of one among Ti/Al/Ti, Mo/Al/Mo, and Ti/Cu.

25. The display device of claim 22, wherein
a partial region of the reflection member does not overlap the first electrode in the direction perpendicular to the substrate.

26. The display device of claim 22, wherein
one side surface of the reflection member and one side surface of the first electrode are aligned with each other.

27. The display device of claim 22, wherein
a lowermost surface of the second electrode is closer to the substrate than an uppermost surface of the partition.

28. The display device of claim 22, wherein
a lower surface of the second electrode is disposed at a same height as an upper surface of the opening of the partition.

29. The display device of claim 22, wherein
an uppermost surface of the partition is disposed closer to the substrate than a lowermost surface of the second electrode.

30. The display device of claim 22, wherein
the partition is disposed on the reflection member.

* * * * *